United States Patent
Shimamura et al.

(10) Patent No.: US 10,700,261 B2
(45) Date of Patent: Jun. 30, 2020

(54) PIEZOELECTRIC MATERIAL, METHOD FOR PRODUCING THE SAME, PIEZOELECTRIC ELEMENT AND COMBUSTION PRESSURE SENSOR

(71) Applicant: NATIONAL INSTITUTE FOR MATERIALS SCIENCE, Tsukuba-shi, Ibaraki (JP)

(72) Inventors: Kiyoshi Shimamura, Ibaraki (JP); Encarnacion Antonia Garcia Villora, Ibaraki (JP); Isao Sakaguchi, Ibaraki (JP); Naoki Ohashi, Tokyo (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 367 days.

(21) Appl. No.: 15/735,277

(22) PCT Filed: Jun. 1, 2016

(86) PCT No.: PCT/JP2016/066276
§ 371 (c)(1),
(2) Date: Dec. 11, 2017

(87) PCT Pub. No.: WO2017/006660
PCT Pub. Date: Jan. 12, 2017

(65) Prior Publication Data
US 2018/0175281 A1    Jun. 21, 2018

(30) Foreign Application Priority Data

Jul. 8, 2015    (JP) .................................. 2015-137274

(51) Int. Cl.
| | | |
|---|---|---|
| H01L 41/187 | (2006.01) | |
| C30B 15/00 | (2006.01) | |
| C30B 33/02 | (2006.01) | |
| H01L 41/41 | (2013.01) | |
| H01L 41/43 | (2013.01) | |
| C30B 29/34 | (2006.01) | |
| H01L 41/113 | (2006.01) | |

(52) U.S. Cl.
CPC .......... *H01L 41/1871* (2013.01); *C30B 15/00* (2013.01); *C30B 29/34* (2013.01); *C30B 33/02* (2013.01); *H01L 41/113* (2013.01); *H01L 41/1132* (2013.01); *H01L 41/187* (2013.01); *H01L 41/41* (2013.01); *H01L 41/43* (2013.01)

(58) Field of Classification Search
CPC . H01L 41/1871; H01L 41/22; H01L 41/1132; H01L 41/187; H01L 41/41; C30B 15/00; C30B 29/34; C30B 33/02
See application file for complete search history.

(56) References Cited

U.S. PATENT DOCUMENTS

2010/0052470 A1    3/2010    Andle et al.

FOREIGN PATENT DOCUMENTS

| CN | 103014865 | | 4/2013 |
| JP | 2016-047786 | * | 4/2016 |
| WO | 2010/102563 | | 9/2010 |
| WO | WO 2010/102563 | * | 9/2010 |

OTHER PUBLICATIONS

Uda et al, "Development of langasite-type crystal optimized for a substrate of high efficiency combustion pressure sensor for automobile use", Outcome of report for Research Program on basic material creation reaserch to realize low-caron society, 11/21, pp. 1-12.*
Yokota et al, Growth of column-shaped and plate-like langasite-type piezoelectric single crystals and theor physical properties:, Sensors and Actuators A:Physical 200 (2013), Oct. 23, 2012, pp. 56-59.*
Translation for JP 2016-47786, Apr. 7, 2016.*
International Search Report dated Aug. 16, 2016 in International Application No. PCT/JP2016/066276.
Zhao, Hengyu et al. "The solid-solution region for the langasite-type $Ga_3TaGa_3Si_2O_{14}$ crystal as determined by a lever rule", Journal of Crystal Growth, Apr. 1, 2015, vol. 415, pp. 111-117.
Yokota, Yuui et al., "Growth of column-shaped and plate-like langasite-type piezoelectric single crystals and their physical properties", Sensors and Actuators A: Physical, vol. 200, Elsevier, Oct. 1, 2013, pp. 56-59.
S. Zhang et al., "Characterization of high temperature piezoelectric crystals with an ordered langasite structure", Journal of Applied Physics, 105, 2009, 114107.
Satoshi Uda et al., "Development of langasite-type crystal optimized for a substrate of high efficiency combustion pressure sensor for automobile use", Outcome report of Research program on basis material creation research project to realize low-carbon society, issued in Nov. 2012, p. 1-12 and its English machine translation.
Extended European Search Report dated Jan. 23, 2019 in corresponding European Patent Application No. 16821131.6.
Notification of Reasons for Refusal dated May 28, 2019 in Japanese Patent Application No. 2015-137274, with Machine Translation.

* cited by examiner

*Primary Examiner* — C Melissa Koslow
(74) *Attorney, Agent, or Firm* — Wenderoth, Lind & Ponack, L.L.P.

(57) ABSTRACT

A piezoelectric material for a combustion pressure sensor, a method for producing the piezoelectric material, and a combustion pressure sensor using the piezoelectric material are provided. The piezoelectric material of the present invention includes a single crystal containing Ca, Ta, an element M (M is Al or Ga), Si, and O, the single crystal has the same crystal structure as the crystal structure of langasite represented by $La_3Ga_5SiO_{14}$, and at least the content of the element M is insufficient for the stoichiometric composition represented by $Ca_3TaM_3Si_2O_{14}$. Preferably, in a case where the element M is Ga, each content of the Ca and the Si is excessive for the stoichiometric composition, and in a case where the element M is Al, the content of the Ca is excessive for the stoichiometric composition, and the content of the Ta is insufficient for the stoichiometric composition.

17 Claims, 9 Drawing Sheets

PIEZOELECTRIC MATERIAL, METHOD FOR PRODUCING THE SAME, PIEZOELECTRIC ELEMENT AND COMBUSTION PRESSURE SENSOR

TECHNICAL FIELD

The present invention relates to a piezoelectric material, a method for producing the piezoelectric material, a piezoelectric element, and a combustion pressure sensor, and in detail, relates to a piezoelectric material including a single crystal that has the same crystal structure as the crystal structure of langasite, and a method for producing the piezoelectric material, and a piezoelectric element and a combustion pressure sensor each using the piezoelectric material.

BACKGROUND ART

In order to improve the fuel efficiency and to reduce $CO_2/NO_x$, research and development of automobiles and the like having an internal-combustion engine have been conducted. In recent years, for this purpose, a combustion pressure sensor to be mounted on an internal-combustion engine has been attracting attention. Since a combustion pressure sensor directly detects the torque fluctuation, both of the low torque fluctuation and the low $CO_2/NO_x$ can be achieved, therefore, the improvement of the fuel efficiency and the reduction of $CO_2/NO_x$ are expected.

Such a combustion pressure sensor is constituted of a piezoelectric material, and as the piezoelectric material, $La_3Ga_5SiO_{14}$ (langasite), a langasite-type crystal having the same crystal structure as the crystal structure of langasite, and the like are known.

Langasite, and a langasite-type crystal do not generate the phase transition until reaching the melting point, and do not have pyroelectricity, therefore, are characterized in that characteristic deterioration at high temperature is small, and there is no fear of electrical signal disturbance such as generation of electromotive force corresponding to the temperature change due to pyroelectricity and of dielectric breakdown due to pyroelectric voltage. However, even in these langasite and langasite-type crystal, the electric resistivity at high temperature is not sufficient for use in an automotive combustion pressure sensor.

Recently, it has been reported that among the langasite-type crystals, an order-type langasite-type crystal having an ordered structure in which each element is regularly arranged at atomic sites in the crystal is preferred for high temperature sensing application (for example, see Non-Patent Literature 1). According to Table 1 of Non-Patent Literature 1, it is shown that the electric resistivities at 500° C. of $Ca_3TaGa_3Si_2O_{14}$ (CTGS) and $Ca_3TaAl_3Si_2O_{14}$ (CTAS) are $1.7\times10^9$ Ω·cm and $2.7\times10^9$ Ω·cm, respectively, and according to FIG. 1, it is shown that the electric resistivity at 427° C. of CTGS is $1.0\times10^{10}$ Ω·cm.

However, even in CTGS and CTAS in Non-Patent Literature 1, it cannot be said that the electric resistivity at high temperature is sufficient.

In addition, focusing on the $La_3Ta_{0.5}Ga_{5.5}O_{14}$ (LTG) crystal that is a langasite-type crystal, a crystal of $Ca_3TaGa_3Si_2O_{14}$ (CTGS) has been designed on the basis of this electric conduction mechanism (for example, Non-Patent Literature 2). According to Non-Patent Literature 2, it has been disclosed that in LTG, the electric conductivity improves due to the metal-deficiency defect, therefore, a CTGS crystal in which the Ga/Ta ratio and the Si content are smaller than those of the stoichiometric composition so as to accompany anti-site defects and to minimize the occurrence of metal deficiency defects has an electric resistivity of $1.8\times10^{10}$ Ω·cm at 400° C.

However, according to Non-Patent Literature 2, among the langasite-type crystals, only CTGS has been disclosed, and CTAS has not been developed yet. In addition, it cannot be said that CTGS of Non-Patent Literature 2 also has sufficient electric resistivity at high temperature.

CITATION LIST

Non-Patent Literature

Non-Patent Literature 1: S. Zhang et al., Journal of Applied Physics, 105, 2009, 114107

Non-Patent Literature 2: Satoshi Uda, and 5 others, "Development of langasite-type crystal optimized for a substrate of high efficiency combustion pressure sensor for automobile use", Outcome report of Research program on basic material creation research project to realize low-carbon society, issued in November, 2012, p. 1-12

SUMMARY OF INVENTION

Technical Problem

An object of the present invention is to provide a piezoelectric material for a combustion pressure sensor, a method for producing the piezoelectric material, and a combustion pressure sensor using the piezoelectric material.

Solution to Problem

The piezoelectric material according to the present invention includes a single crystal containing Ca, Ta, an element M (M is Al or Ga), Si, and O, in which the single crystal has the same crystal structure as the crystal structure of langasite represented by $La_3Ga_5SiO_{14}$, and at least the content of the element M is insufficient for the stoichiometric composition represented by $Ca_3TaAl_3Si_2O_{14}$, and in this way, the above-described problems are solved.

The element M may be Ga, and each content of the Ca and the Si may be excessive for the stoichiometric composition.

A mole ratio of the Ca to the Ta may be more than 3.11 and 3.31 or less, a mole ratio of the M to the Ta may be 2.45 or more and 2.79 or less, and a mole ratio of the Si to the Ta may be more than 1.98 and 2.09 or less.

The element M may be Al, a content of the Ca may be excessive for the stoichiometric composition, and a content of the Ta may be insufficient for the stoichiometric composition.

A mole ratio of the Ca to the Si may be more than 1.44 and 1.63 or less, a mole ratio of the Ta to the Si may be 0.45 or more and 0.49 or less, and a mole ratio of the M to the Si may be 1.33 or more and 1.47 or less.

An oxygen diffusion coefficient of the single crystal may be less than $7.0\times10^{-16}$ cm²/s.

Electric resistivity at 400° C. in the single crystal may be in a range of $5.0\times10^{10}$ Ω·cm or more and $9.0\times10^{10}$ Ω·cm or less.

The single crystal may be represented by the general formula

where the element M may be Ga, and
parameters p, q, r, s, and t may be p+q+r+s=9, and may satisfy $3.15 < p \leq 3.25$, $0.98 \leq q \leq 1.02$, $2.5 \leq r \leq 2.83$, $2.004 < s \leq 2.05$, and $13.9 \leq t \leq 14.1$.

The parameters p, q, r, s, and t may satisfy $3.17 \leq p \leq 3.18$, $0.99 \leq q \leq 1.015$, $2.5 \leq r \leq 2.8$, $2.01 \leq s \leq 2.02$, and $13.9 \leq t \leq 14.1$.

The single crystal may be represented by the general formula

where the element M may be Al, and
parameters p, q, r, s, and t may be p+q+r+s=9, and may satisfy $2.94 < p \leq 3.25$, $0.95 \leq q < 1.01$, $2.8 \leq r < 3.01$, $2 < s \leq 2.1$, and $13.9 \leq t \leq 14.1$.

The parameters p, q, r, s, and t may satisfy $3 < p \leq 3.1$, $0.97 \leq q \leq 0.99$, $2.9 \leq r \leq 2.95$, $2.03 \leq s \leq 2.07$, and $13.9 \leq t \leq 14.1$.

A method for producing the above-described piezoelectric material according to the present invention includes the following steps of: melting a raw material containing Ca, Ta, an element M (M is Al or Ga), Si, and O; and bringing a seed crystal into contact with a melt of the raw material obtained in the step of melting, and pulling up the seed crystal, in which the step of melting and the step of pulling up are performed under an inert gas, and the oxygen content in the inert gas satisfies a range of 0% by volume or more and 1.5% by volume or less, and in this way, the above-described problems are solved.

The raw material may be prepared such that the Ca, the Ta, the element M, and the Si in the raw material satisfy the relationship of Ca:Ta:element M:Si=3:1:3:2 (atomic ratio).

An oxygen content in the inert gas may be 0.5% by volume or more. The raw material may be filled in a crucible made of Ir, and the step of melting and the step of pulling up may be performed under an inert gas where oxygen content satisfies a range of 0% by volume or more and 1.3% by volume or less.

The method may further comprise the step of performing heat treatment in an inert gas or in the air.

The step of performing heat-treatment may be performed in a temperature range of 1150° C. or more and 1250° C. or less for 2 hours or more and 24 hours or less in an inert gas.

In a piezoelectric element including the piezoelectric material according to the present invention, the piezoelectric material is the above-described piezoelectric material, and in this way, the above-described problems are solved.

In a combustion pressure sensor including the piezoelectric element according to the present invention, the piezoelectric element is the above-described piezoelectric element, and in this way, the above-described problems are solved.

Advantageous Effects of Invention

Since the piezoelectric material according to the present invention includes a single crystal containing Ca, Ta, an element M (M is Al or Ga), Si, and O, and has the same crystal structure as the crystal structure of langasite represented by $La_3Ga_5SiO_{14}$, as in the case of the langasite crystal, the piezoelectric material has no phase transition until reaching the melting point, and no pyroelectricity, therefore, characteristic deterioration at high temperature is small, and the piezoelectric material is advantageous for a piezoelectric element that is used at high temperature. In addition, in the piezoelectric material according to the present invention, at least the content of the element M is insufficient for the stoichiometric composition represented by $Ca_3TaM_3Si_2O_{14}$, therefore, the piezoelectric material is a single crystal having an electric resistivity at 400° C. of exceeding $1.0 \times 10^{10}$ Ω·cm. As a result, in an internal-combustion engine or the like that is used at high temperature, the piezoelectric material is advantageous for a combustion pressure sensor on which a piezoelectric element has been mounted. More preferably, in the piezoelectric material according to the present invention, in a case where the element M is Ga, each content of the Ca and the Si is excessive for the stoichiometric composition, and in a case where the element M is Al, the content of the Ca is excessive for the stoichiometric composition, and the content of the Ta is insufficient for the stoichiometric composition. In this way, high electric resistivity at high temperature can be achieved. Composition control in such a single crystal containing Ca, Ta, an element M (M is Al or Ga), Si, and O has been found by experiments by the inventors of the present application.

DESCRIPTION OF EMBODIMENTS

Figure 1:
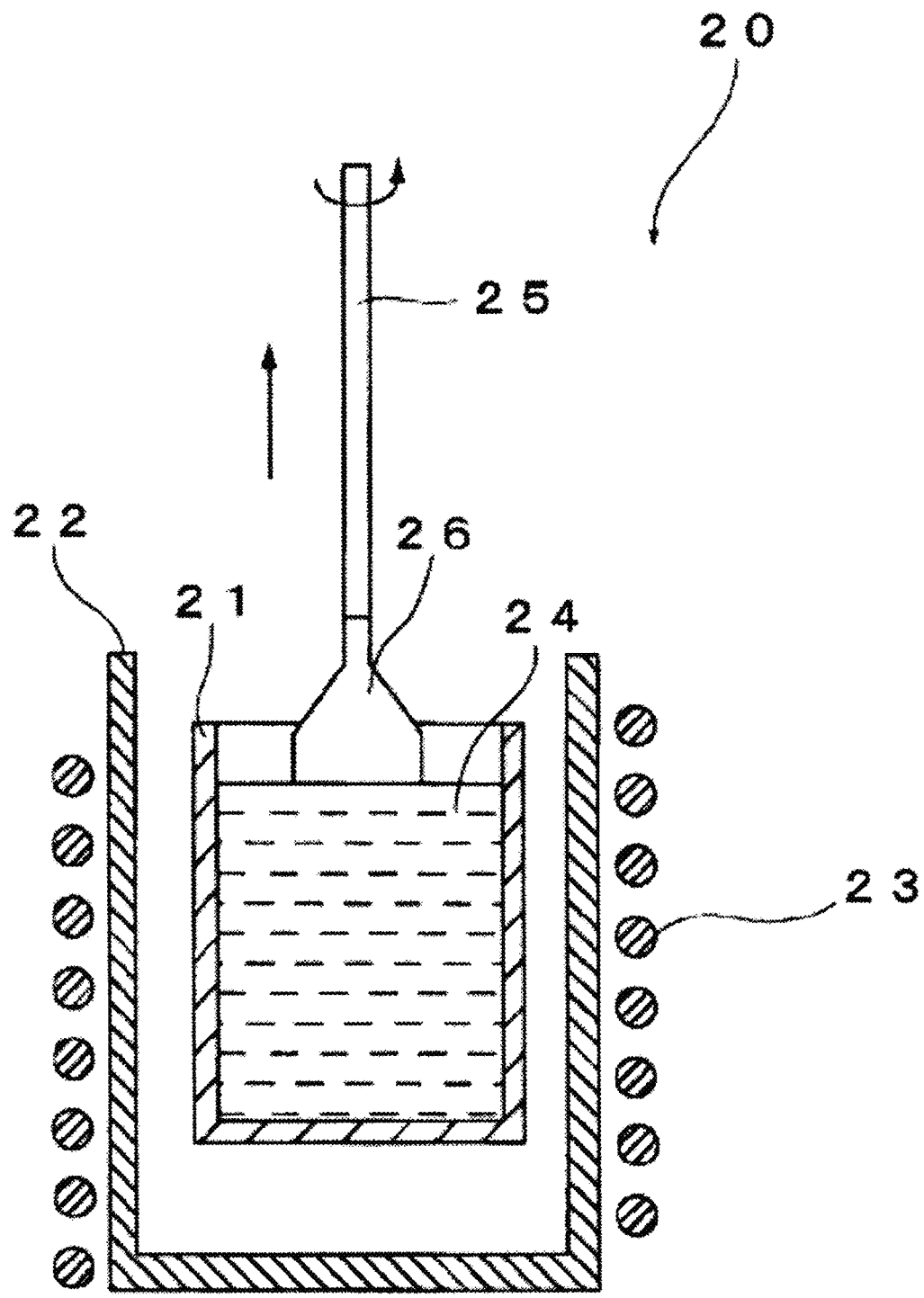
FIG. 1 is a schematic diagram of a single crystal growth device that is used in a method for producing a piezoelectric material including the single crystal of the present invention.

Hereinafter, the embodiment of the present invention will be described with reference to the drawings. Note that the same elements are given the same numbers, and the description thereof is omitted.

At first, the piezoelectric material of the present invention, and a method for producing the piezoelectric material will be described.

The piezoelectric material of the present invention includes a single crystal containing Ca, Ta, an element M (M is Al or Ga), Si, and O. Note that in the present specification, for the sake of simplicity, a single crystal in which the element M is Al may be referred to as a CTAS single crystal, and a single crystal in which the element M is Ga may be referred to as a CTGS single crystal, in some cases. These single crystals have the same crystal structure as the crystal structure of the langasite represented by $La_3Ga_5SiO_{14}$. In detail, these single crystals have a trigonal crystal structure and belong to point group 32 and space group P321. As described above, since the single crystal constituting the piezoelectric material of the present invention (simply referred to as the single crystal of the present invention) has the same crystal structure as the crystal structure of langasite, as in the case of the langasite, the single crystal has no phase transition until reaching the melting point, and no pyroelectricity, therefore, characteristic deterioration at high temperature is small. In addition, since the single crystal of the present invention has the same crystal structure as the crystal structure of langasite, as in the case of the langasite, the single crystal has a high piezoelectric constant. Accordingly, the single crystal of the present invention is advantageous for a piezoelectric element that is used at high temperature.

Further, according to the single crystal constituting the piezoelectric material of the present invention, the element M is insufficient for the stoichiometric composition ($Ca_3TaM_3Si_2O_{14}$). In this way, in the piezoelectric material of the present invention, the electric resistivity at 400° C. exceeds $1.0 \times 10^{10}$ Ω·cm. The measurement of the electric resistivity may be performed by, for example, a three-terminal method. This value clears the specifications of the combustion pressure sensor on which the piezoelectric element is mounted in an internal-combustion engine or the like that is used at high temperature.

Preferably, according to the single crystal constituting the piezoelectric material of the present invention, in a case where the element M is Ga, each content of the Ca and the Si is excessive for the stoichiometric composition ($Ca_3TaGa_3Si_2O_{14}$), and in a case where the element M is Al, the content of the Ca is excessive for the stoichiometric composition ($Ca_3TaAl_3Si_2O_{14}$), and the content of the Ta is insufficient for the stoichiometric composition. The inventors of the present application have found that by controlling the deviation of a specific cation to the stoichiometric composition, a high electric resistivity at high temperature can be achieved. Note that such a state that the specific cation is deviated from the stoichiometric composition can be confirmed, for example, by transmission spectrum measurement and composition analysis.

More preferably, in a case where the M is Ga, a mole ratio of the Ca to the Ta is more than 3.11 and 3.31 or less, a mole ratio of the M to the Ta is 2.45 or more and 2.79 or less, and a mole ratio of the Si to the Ta is more than 1.98 and 2.09 or less. As described above, by shifting a specific cation from the stoichiometric composition, the high electric resistivity can be achieved.

Furthermore preferably, in a case where the M is Ga, a mole ratio of the Ca to the Ta is more than 3.11 and 3.21 or less, a mole ratio of the M to the Ta is 2.5 or more and 2.79 or less, and a mole ratio of the Si to the Ta is more than 1.98 and 2.0 or less. As described above, by shifting a specific cation in a specific range from the stoichiometric composition, the high electric resistivity can be reliably achieved.

More preferably, in a case where the M is Al, a mole ratio of the Ca to the Si is more than 1.44 and 1.63 or less, a mole ratio of the Ta to the Si is 0.45 or more and 0.49 or less, and a mole ratio of the M to the Si is 1.33 or more and 1.47 or less. As described above, by shifting a specific cation from the stoichiometric composition, the high electric resistivity can be achieved.

Furthermore preferably, in a case where the M is Al, a mole ratio of the Ca to the Si is more than 1.44 and 1.52 or less, a mole ratio of the Ta to the Si is 0.46 or more and 0.49 or less, and a mole ratio of the M to the Si is 1.39 or more and 1.45 or less. As described above, by shifting a specific cation in a specific range from the stoichiometric composition, the high electric resistivity can be reliably achieved.

Since the piezoelectric material according to the present invention is constituted of an oxide single crystal, usually, there may be oxygen defects, and it is better to control the single crystal so that the oxygen defects are reduced. It is known that an ordinary oxide single crystal such as lithium tantalate, or lithium niobate has absorption as the number of oxygen defects increases, the single crystal becomes colored, and the electric resistivity becomes small. However, the single crystal of the present invention is controlled so that the oxygen defects are reduced even if the single crystal is colored, and the electric resistivity is increased. This is a result different from the existing technical common sense, and has been found by experiments by the inventors of the present application.

In more detail, the oxygen diffusion coefficient of the single crystal of the present invention is controlled so as to be less than $7.0 \times 10^{-16}$ cm$^2$/s. In this way, the oxygen defects are controlled to be in a predetermined amount, therefore, the electric resistivity can be increased. Furthermore preferably, the oxygen diffusion coefficient of the single crystal of the present invention satisfies $6.5 \times 10^{-16}$ cm$^2$/s or less. In this way, the oxygen defects are controlled within an extremely small range, therefore, the electric resistivity can be reliably increased. There is no restriction on the lower limit in particular, and in order to satisfy the practically required characteristics, there is no problem as long as the oxygen diffusion coefficient is $5.5 \times 10^{-15}$ cm$^2$/s or more. The oxygen diffusion coefficient can be determined by measuring a diffusion profile using a secondary ion mass spectrometer (SIMS) or the like.

The inventors of the present application have found that by controlling the deviation of a specific cation from the stoichiometric composition, and further by controlling the oxygen defects, the single crystal of the present invention achieves the high electric resistivity even at high temperature. That is, it should be noted that the single crystal of the present invention is different from a single crystal having the existing stoichiometric composition, and has a composition that is intentionally deviated from the stoichiometric composition.

Preferably, the single crystal of the present invention is a CTAS single crystal in which the element M is Al. In this way, particularly excellent electric resistivity can be achieved. For example, in a case where the element M is Al, the electric resistivity at 400° C. achieves $5.0 \times 10^{10}$ Ω·cm or more. Further, the upper limit is not particularly limited, however, for example, $9.0 \times 10^{10}$ Ω·cm or less.

The single crystal of the present invention is preferably represented by the general formula $Ca_p Ta_q M_r Si_s O_t$ in which the element M is Ga, and the parameters p, q, r, s, and t are p+q+r+s=9, and satisfy $3.15 < p \leq 3.25$, $0.98 \leq q \leq 1.02$, $2.5 \leq r \leq 2.83$, $2.004 < s \leq 2.05$, and $13.9 \leq t \leq 14.1$.

In this way, the above-described high electric resistivity can be achieved.

More preferably, in a case where the element M is Ga, the parameters p, q, r, s, and t satisfy $3.17 \leq p \leq 3.18$, $0.99 \leq q \leq 1.015$, $2.5 \leq r \leq 2.8$, $2.01 \leq s \leq 2.02$, and $13.9 \leq t \leq 14.1$.

In this way, the particularly high electric resistivity can be achieved.

The single crystal of the present invention is preferably represented by the general formula $Ca_p Ta_q M_r Si_s O_t$ in which the element M is Al, and the parameters p, q, r, s, and t are p+q+r+s=9, and satisfy $2.94 < p \leq 3.25$, $0.95 \leq q < 1.01$, $2.8 \leq r < 3.01$, $2 < s \leq 2.1$, and $13.9 \leq t \leq 14.1$.

In this way, the above-described high electric resistivity can be achieved.

More preferably, in a case where the element M is Al, the parameters p, q, r, s, and t satisfy $3 < p \leq 3.1$, $0.97 \leq q \leq 0.99$, $2.9 \leq r \leq 2.95$, $2.03 \leq s \leq 2.07$, and $13.9 \leq t \leq 14.1$.

In this way, the particularly high electric resistivity can be achieved.

Such a chemical formula can be obtained, for example, by fluorescent X-ray analysis (XRF). The results of the composition analysis by XRF are obtained as the weight ratio (wt %) of each element other than oxygen. By dividing the weight ratio by the atomic weight of each element, the mole ratio can be obtained. By recalculating this mole ratio so that the total number of positive ions is 9, the above-described chemical formula can be obtained. As described above, the results of the composition analysis show only the mole ratio of each positive ion, and the apparent number varies in any way by recalculating with the change of the total number. However, it should be noted that the mole ratio itself of each positive ion does not change even if the total number of positive ions is changed.

Next, it should be noted that an exemplary method for producing a piezoelectric material including the single crystal of the present invention will be described, but it is merely an example. Hereinafter, a case of producing the single crystal of the present invention by a Czochralski method (CZ method) will be described.

FIG. 1 is a schematic diagram of a single crystal growth device that is used in a method for producing a piezoelectric material including the single crystal of the present invention.

In FIG. 1, a crystal pulling furnace 20 used for producing a single crystal is shown. The crystal pulling furnace 20 is mainly provided with a crucible 21 made of iridium (Ir) or platinum (Pt), a cylindrical container 22 made of ceramic for housing the crucible 21, and a high frequency coil 23 wound around the cylindrical container 22. The high frequency coil 23 generates an induction current in the crucible 21 and heats the crucible 21. By a CZ method using the crystal pulling furnace 20, a single crystal to be the above-described piezoelectric material is grown. The production process will be described in detail.

Step S110: A raw material containing Ca, Ta, an element M (M is Al or Ga), Si, and O is melted.

At first, $CaCO_3$ powder, $Ta_2O_5$ powder, $SiO_2$ powder, and $Al_2O_3$ powder or $Ga_2O_3$ powder are dry-mixed, the powder raw material is fired in the air, and a raw material containing Ca, Ta, an element M (M is Al or Ga), Si, and O is prepared. The raw material powder is prepared such that the mixing ratio of the Ca, the Ta, the element M, and the Si satisfies the relationship of Ca:Ta:element M:Si=3:1:3:2 (atomic ratio), and the fired body also satisfies the same atomic ratio. In this way, the finally obtained single crystal can have the same crystal structure as the crystal structure of langasite. Further, the kind of the raw material powder is not limited to this, however, the above-described oxides and carbonates are preferred because of being available and easy to handle.

Next, the above-described fired body is filled in a crucible 21. A high frequency current is applied to a high frequency coil 23 to heat the crucible 21, and the fired body in the crucible 21 is heated from room temperature to a temperature at which the powder raw material can be melted. In this way, the fired body is melted, and a melt 24 is obtained.

Step S120: A seed crystal is brought into contact with the melt of raw material obtained in Step S110 and pulled up.

The seed crystal to be brought into contact with a melt 24 is, for example, a seed crystal 25 that is used as a rod-shaped crystal pulling shaft. As the seed crystal 25, for example, langasite represented by $La_3Ga_5SiO_{14}$, or a langasite-type single crystal such as $Ca_3TaGa_3Si_2O_{14}$ (CTGS), or $Ca_3TaAl_3Si_2O_{14}$ (CTAS), or the like can be used.

After bringing the tip of the seed crystal 25 into contact with the melt 24, the seed crystal 25 is pulled up at a predetermined pulling speed while rotating the seed crystal 25 at a predetermined rotation speed. The rotation speed of the seed crystal 25 is preferably 3 to 50 rpm, and more preferably 10 to 15 rpm. The pulling speed of the seed crystal 25 is preferably 0.1 to 10 mm/h, and more preferably 0.3 to 0.8 mm/h.

Step S110 and Step S120 are performed under an inert gas, and the oxygen content in an inert gas satisfies a range of 0% by volume or more and 1.5% by volume or less. In a case where exceeding 1.5% by volume of oxygen is contained, the oxygen amount is too large to control the desired cation such that the desired cation is deviates from the stoichiometric composition/to control the oxygen defects, therefore, a single crystal having an electric resistivity exceeding $1.0 \times 10^{10}$ Ω·cm at 400° C. cannot be obtained. In addition, as the inert gas, a rare gas of $N_2$, or He, Ne, Ar, or the like can be used, and preferably, $N_2$ is advantageous from the viewpoint of controlling the amount of the oxygen to be contained. The oxygen content in an inert gas is preferably 0.5% by volume or more. In this way, the desired cation is controlled such that the desired cation is deviated from the stoichiometric composition and the oxygen defects are controlled so as to be a predetermined amount, therefore, the high electric resistivity can be achieved. The oxygen content is more preferably 1% by volume or more. Further, the crucible 21 and the like in the crystal pulling furnace 20 may be hermetically sealed in a sealed housing to control the atmosphere.

Preferably, in the production method of the present invention, a crucible made of Ir is employed as the crucible 21, and Step S110 and Step S120 are performed under an inert gas satisfying the range of the oxygen content of 0% by volume or more to 1.2% by volume or less. In this way, the particularly high electric resistivity can be achieved. By using a crucible made of Ir rather than a crucible made of Pt, the influence of impurities can be reduced and a high-quality single crystal can be obtained.

As described above, by pulling up the seed crystal 25, a grown crystal 26 in a bulk state can be obtained at the tip of the seed crystal 25. The grown crystal 26 is a piezoelectric material that includes a single crystal containing the above-described Ca, Ta, an element M (M is Al or Ga), Si, and O, and has the same crystal structure as the crystal structure of langasite. By cutting out the obtained grown crystal 26 into a piece having a desired size, the grown crystal 26 can be used for a piezoelectric element described later.

According to the process described above, the grown crystal 26 that is a piezoelectric material including the single crystal of the present invention can be easily produced, and further the increase in size of the grown crystal 26 can be easily realized.

Note that the single crystal of the present invention can be obtained not only by the CZ method described with reference to FIG. 1, but also by a liquid phase growth method such as an edge defined film fed growth method (EFG method), a Bridgman method, a floating zone method (FZ method), or a Verneuil method.

By subjecting the obtained single crystal to heat treatment in an inert gas such as nitrogen or in the air, the electric resistivity can further be improved. This is considered to be due to the acceleration of deviation of a cation from the stoichiometric composition by heat treatment. Preferably, the heat treatment is performed under the conditions in an inert gas or in the air, at a temperature lower than the single crystal growth temperature, and in the range of 2 hours to 24 hours. In this way, the electric resistivity of CTGS is increased. More preferably, the heat treatment is performed under the conditions in nitrogen as an inert gas, in the temperature range of 1150° C. or more and 1250° C. or less, and in the range of 2 hours to 24 hours. In this way, the oxygen defects in a single crystal are controlled, and the electric resistivity is reliably increased.

Herein, the differences between the single crystal of the present invention, CTGS and CTAS described in Non-Patent Literature 1, and CTGS described in Non-Patent Literature 2 will be described.

As shown in Table 1 in Non-Patent Literature 1, by using a crucible made of Ir under an atmosphere of $N_2$ and 1% by volume of $O_2$, CTGS and CTAS single crystals having electric resistivities of $1.7 \times 10^9$ and $2.7 \times 10^9$ Ω·cm, respectively at 500° C. are obtained. Further, according to FIG. 1 in Non-Patent Literature, it is shown that the electric resistivity of CTGS at 427° C. is $1.0 \times 10^{10}$ Ω·cm. However, in Non-Patent Literature 1, CTGS or CTAS of which the electric resistivity at 400° C. exceeds $1.0 \times 10^{10}$ Ω·cm cannot be confirmed, and the production method has not been revealed yet. Furthermore, in Non-Patent Literature 1, the more preferred composition of CTGS or CTAS has not been also disclosed at all, and it has not been suggested at all that, in particular, the insufficiency of the element M for the stoichiometric composition contributes to the improvement of the electric resistivity, and the oxygen defects are controlled so as to be decreased.

According to Non-Patent Literature 2, it has been disclosed that a CTGS crystal in which the Ga/Ta ratio and the Si content are smaller than those of the stoichiometric composition has an electric resistivity of $1.8 \times 10^{10}$ Ω·cm at 400° C. It is concluded that the excessive Ta and Si defects contribute to the improvement of the electric resistivity, however, it has not been suggested at all that in addition to the insufficiency of the element M (Ga), the excessive Ca and Si, and further, the control of oxygen defects contribute to the improvement of the electric resistivity. Moreover, in Non-Patent Literature 2, there is no clear description of CTAS in which the element M is Ta.

Next, a piezoelectric element using the piezoelectric material of the present invention will be described.

Figure 2:
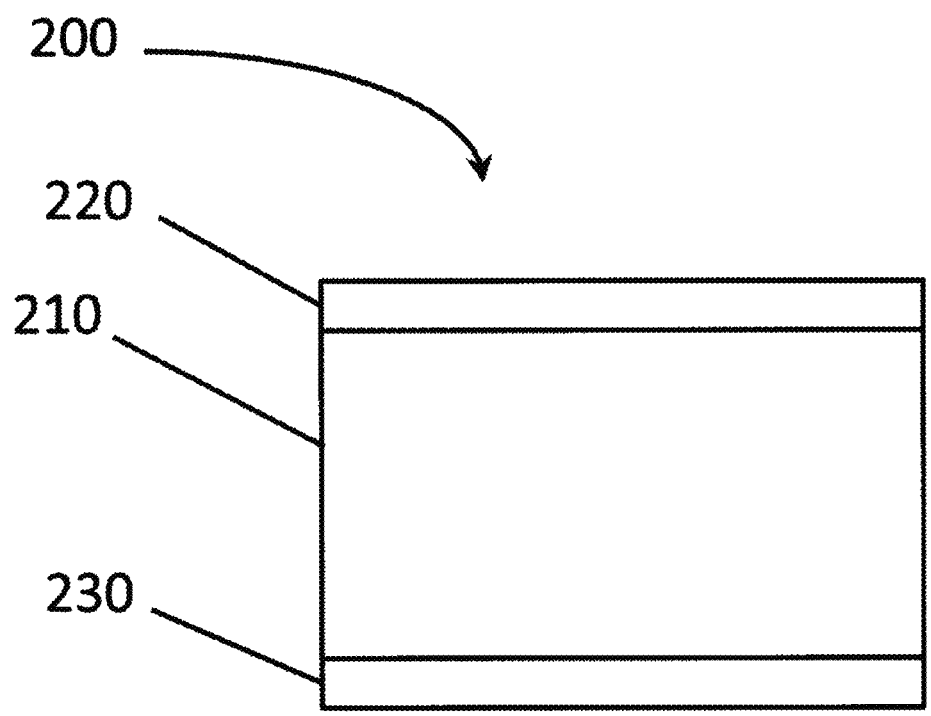
FIG. 2 is a schematic diagram showing the piezoelectric element of the present invention.

FIG. 2 is a schematic diagram showing the piezoelectric element of the present invention.

A piezoelectric element 200 includes a piezoelectric material 210 of the present invention. The piezoelectric material 210 is a piezoelectric material made of the above-described single crystal, therefore, the description is omitted. An electrode 220 is provided on one surface of the piezoelectric material 210, and an electrode 230 is provided on the opposite surface. Note that the electrodes 220 and 230 are arranged on the y plane of the single crystal constituting the piezoelectric material 210. When stress is applied in a direction perpendicular to the y plane of the piezoelectric material 210 of the piezoelectric element 200, electric charge is generated and is output through the electrodes 220 and 230. The piezoelectric element 200 of the present invention includes the piezoelectric material made of the above-described single crystal, therefore, has not only a high piezoelectric constant but also a high electric resistivity even at high temperature. Accordingly, when such a piezoelectric element 200 is assembled in an appropriate housing, and installed in a combustion chamber in which the temperature becomes high, such as an internal-combustion engine, the piezoelectric element 200 functions as a combustion pressure sensor. That is, the piezoelectric element 200 is installed in a cylinder of an engine, and the combustion pressure of the engine can be detected as a minute change in electric charge. However, it is not necessarily limited to the y plane in the design of the device.

Next, the present invention will be described in detail using specific Examples, however, it should be noted that the present invention is not limited to the following Examples.

EXAMPLES

Example 1

In Example 1, a piezoelectric material including a CTGS single crystal in which the element M is Ga was produced by a CZ method that had been described with reference to FIG. 1.

At first, a raw material containing Ca, Ta, Ga, Si, and O was prepared. Specifically, calcium carbonate ($CaCO_3$) raw material powder (132.939 g) having a purity of 99.99%, tantalum oxide ($Ta_2O_5$) raw material powder (97.827 g) having a purity of 99.99%, gallium oxide ($Ga_2O_3$) raw material powder (124.492 g) having a purity of 99.99%, and silicon dioxide ($SiO_2$) raw material powder (53.216 g) having a purity of 99.99% were dry-mixed, and the resultant mixture was placed in an alumina crucible, and a fired body was obtained.

Ca, Ta, Ga and Si in the mixed raw material powder satisfied Ca:Ta:Ga:Si=3:1:3:2 (atom ratio). As the firing temperature profile, the temperature was raised from 0° C. to 1260° C. over 8 hours, retained at a temperature of 1260° C. for 25 hours, and then cooled down to 0° C. over 8 hours. As a result of powder X-ray diffraction of the obtained fired body, it was confirmed that the fired body has the same crystal structure as the crystal structure of langasite, and is obtained in a single phase. In addition, it was confirmed that Ca, Ta, Ga, and Si in the obtained fired body satisfy Ca:Ta:Ga:Si=3:1:3:2 (atom ratio). The fired body thus obtained was used as a raw material containing Ca, Ta, Ga, Si, and O.

The fired body thus obtained was filled in a crucible made of Ir, and melted (Step S110). The weight of the raw material powder filled in the crucible was 342 g. The shape of the crucible was cylindrical, the diameter was around 50 mm, and the height was around 50 mm.

Next, the tip of a seed crystal (size: 2 mm×2 mm×40 mm, a axis) of a square-bar shape of the CTGS represented by $Ca_3TaGa_3Si_2O_{14}$ was brought into contact with a melt, the seed crystal was pulled up at a speed of 0.5 mm per hour while being rotated at a rotation speed of 12 rpm, and a single crystal in a bulk state was grown (Step S120). Note that after completion of the growth, it took 40 hours to cool down to room temperature.

Figure 3:
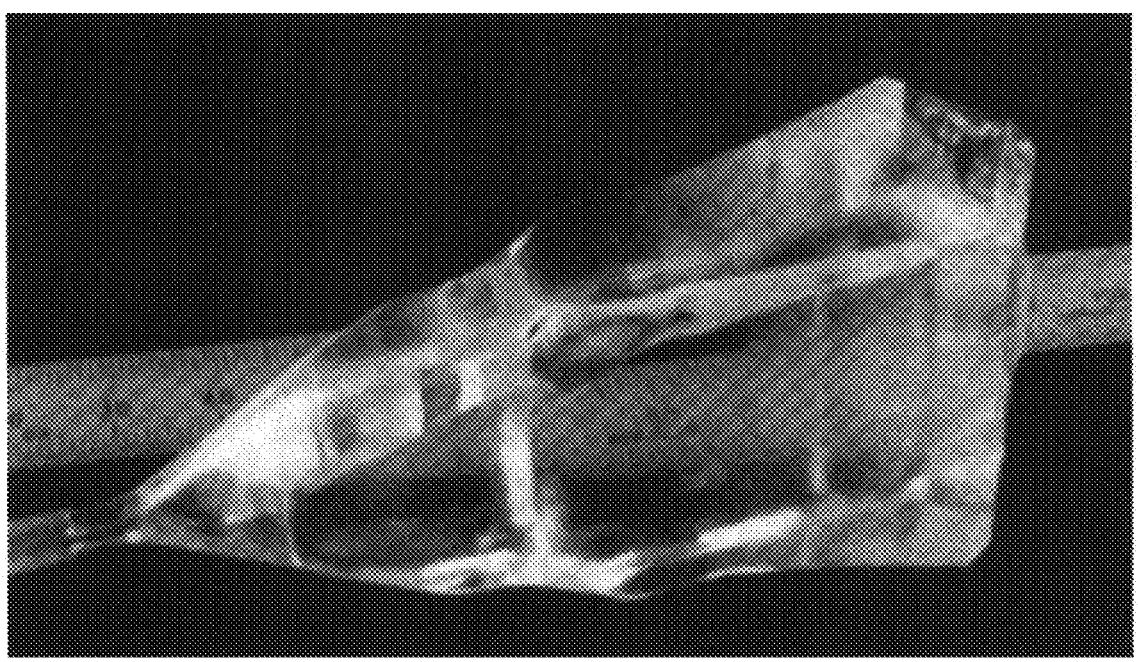
FIG. 3 is a drawing showing the observation result of a single crystal of Example 1.

Growth of this crystal was performed under an atmosphere of $N_2$ gas containing oxygen as the inert gas. The oxygen content was 1.3% by volume. The appearance of the obtained single crystal was observed. The result is shown in FIG. 3. Next, as a result of powder X-ray diffraction of the obtained single crystal, it was confirmed that the single crystal has the same crystal structure as the crystal structure of langasite, and is obtained in a single phase.

By fluorescent X-ray analysis (XRF), the composition (mole ratio of Ca, Ta, Ga, and Si) of the single crystal was confirmed. The results are shown in Tables 2 and 3.

Figure 6:
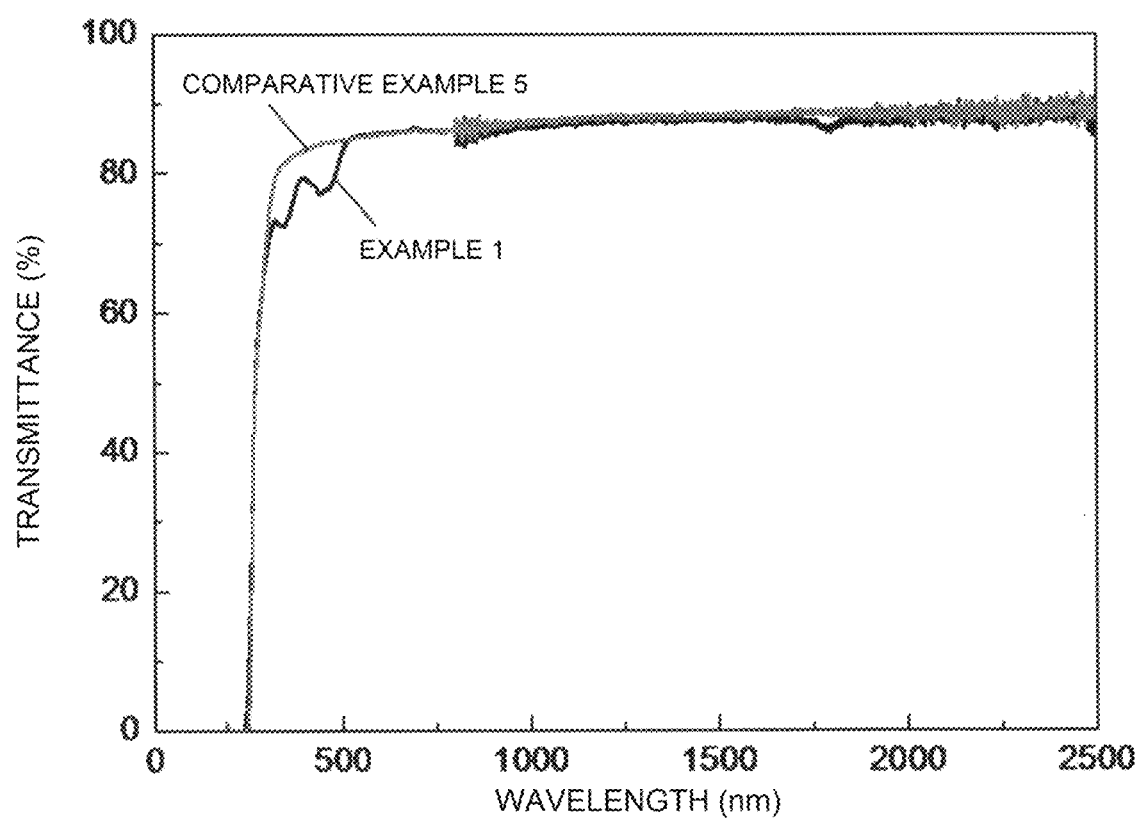
FIG. 6 is a drawing showing the transmission spectra of single crystals of Example 1 and Comparative Example 5.

A y-cut plate having a 10 mm square and a 1 mm thickness was cut out from the single crystal, and both surfaces of the y-cut plate were mirror polished. The transmission spectrum of this sample was measured. The results are shown in FIG. 6.

Next, the oxygen diffusion coefficient of the single crystal was determined. Oxygen in the oxide includes oxygen with mass numbers of 16, 17, or 18 as the stable isotope. A large number of these oxygen is oxygen with a mass number of 16, and oxygen with a mass number of 18 is present around 0.2%. By using the $^{18}O$ (oxygen with a mass number of 18) as a tracer, the oxygen diffusion from the surface can be observed.

The oxygen diffusion in an oxide occurs via defects in the crystal, that is, oxygen defects (oxygen vacancies). If an oxygen diffusion profile that is the concentration gradient is obtained by using the $^{18}O$ as a tracer, the oxygen tracer diffusion coefficient can be obtained. The diffusion coefficient of the tracer has a relationship with the vacancy concentration and the diffusion coefficient of the vacancy as described below.

$$D_T \propto C[V] \cdot D_v$$

Herein, $D_T$ is a diffusion coefficient of a tracer, $C[V]$ is a vacancy concentration, and $D_v$ is a diffusion coefficient of the vacancies. Since the $D_v$ does not depend on the concentration, the large or small of the $D_T$ becomes the large or small of the vacancy concentration.

The oxygen diffusion was performed by a gas phase-solid phase exchange method using a stable isotope of $^{18}O$. A mirror-polished single crystal was placed in a platinum container, and the platinum container was inserted into a quartz tube. In this situation, the inside of the quartz container was depressurized to $5 \times 10^{-7}$ torr by a rotary pump and a turbo molecular pump. At this time, the quartz tube was maintained in the air. After the degree of vacuum reached, $^{18}O_2$ gas was introduced. Next, the quartz tube into which $^{18}O_2$ gas had been introduced was inserted into a furnace heated to 1000° C., and was subjected to diffusion annealing for 4 hours. At this time, the concentration of $^{18}O_2$ on a surface of a single crystal was constant, and $^{16}O$ and $^{18}O$ in the single crystal were replaced with each other, and the $^{18}O$ diffused inside the single crystal. The quartz tube was pulled out from the heating furnace in a predetermined time, and was rapidly cooled in the air. After the quartz tube was cooled down to room temperature, the $^{18}O_2$ was recovered.

Figure 8:
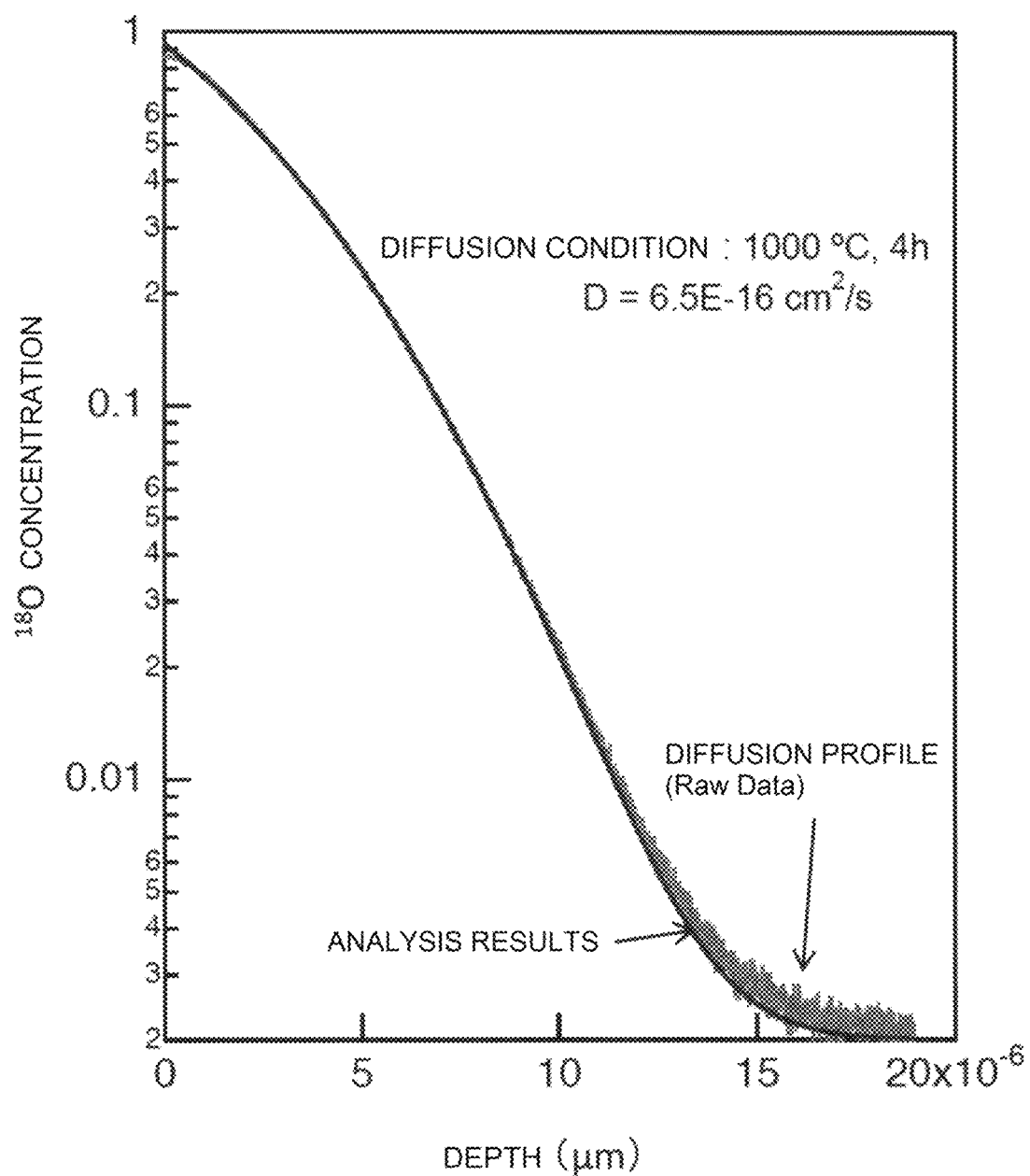
FIG. 8 is a drawing showing the $^{18}O$ oxygen diffusion profile of a single crystal of Example 1.

The single crystal was taken out from the quartz tube, the oxygen diffusion profile was measured using a secondary ion mass spectrometer (SIMS). In the measurement, the intensity of $^{16}O$ and the intensity of $^{18}O$ were measured as one cycle, and the depth of each cycle was calculated from the sputtering rate. The results are shown in FIG. 8.

Figure 10:
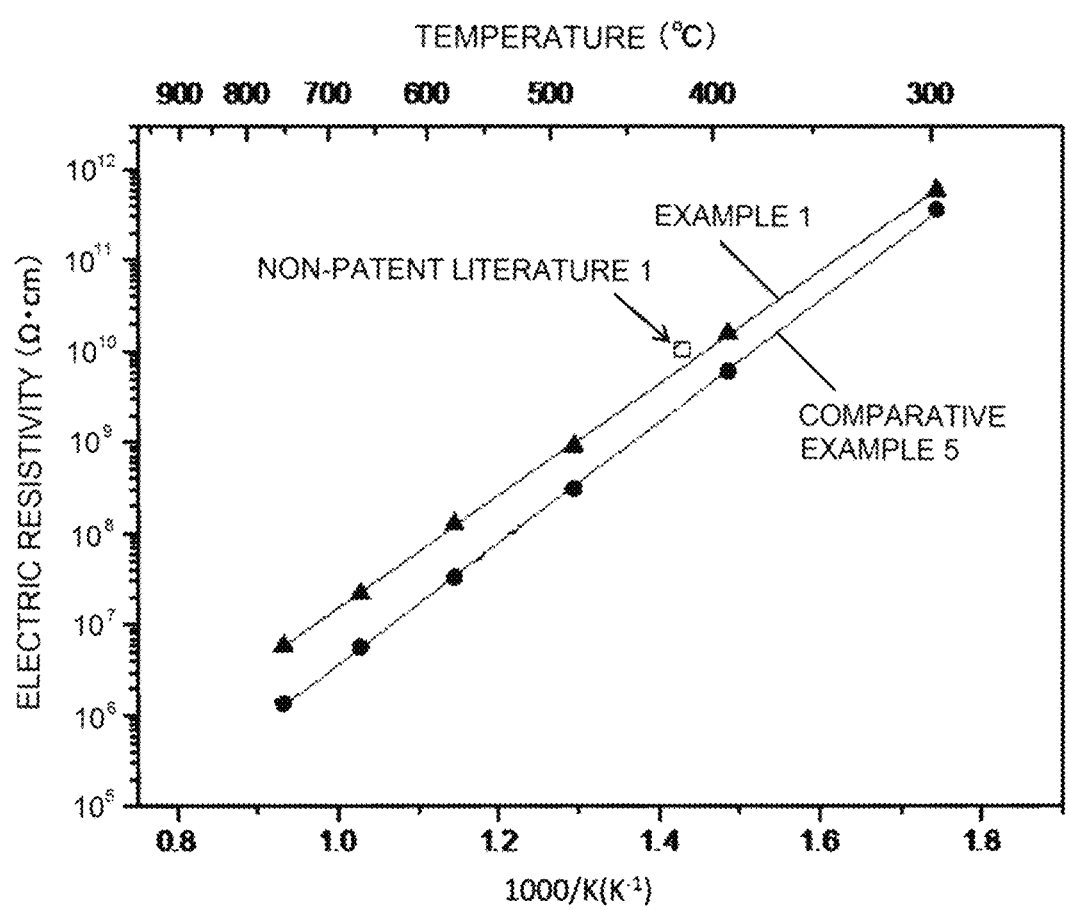
FIG. 10 is a drawing showing the temperature dependency of the electric resistivity of single crystals of Example 1 and Comparative Example 5.

In addition, as described above with reference to FIG. 2, a platinum electrode was formed on the y plane of this sample by sputtering, and a piezoelectric element was produced. The temperature dependence of the electric resistivity of this piezoelectric element was measured by a three-terminal method, and the piezoelectric characteristics (piezoelectric constant $d_{11}$ and electromechanical coupling constant $K_{12}$) were measured with an impedance analyzer and an LCR meter. The results are shown in FIG. 10 and Table 4.

Example 2

In Example 2, a piezoelectric material including a CTGS single crystal in which the element M is Ga was produced by a CZ method that had been described with reference to FIG. 1 in the similar manner as in Example 1. However, different from Example 1, at the time of single crystal growth, the single crystal growth was performed under an atmosphere of $N_2$ gas not containing oxygen as the inert gas. In the similar manner as in Example 1, the appearance of the single crystal was observed, and the powder X-ray diffraction was performed, as a result, it was identified that the single crystal has the same crystal structure as the crystal structure of langasite. In the similar manner as in Example 1, the transmission spectrum and the electric resistivity were measured. The results are shown in Table 4.

Example 3

In Example 3, a piezoelectric material including a CTGS single crystal in which the element M is Ga was produced by a CZ method that had been described with reference to FIG. 1 in the similar manner as in Example 2. However, different from Example 2, a crucible made of Pt was employed in the single crystal growth. In the similar manner as in Example 1, the appearance of the single crystal was observed, and the powder X-ray diffraction was performed, as a result, it was identified that the single crystal has the same crystal structure as the crystal structure of langasite. In the similar manner as in Example 1, the transmission spectrum and the electric resistivity were measured. The results are shown in Table 4.

Example 4

In Example 4, a piezoelectric material including a CTGS single crystal in which the element M is Ga was produced by a CZ method that had been described with reference to FIG. 1 in the similar manner as in Example 1. However, different from Example 1, a crucible made of Pt was employed in the single crystal growth, and the oxygen content in the inert gas at the time of single crystal growth was 1.2% by volume. In the similar manner as in Example 1, the appearance of the single crystal was observed, and the powder X-ray diffraction was performed, as a result, it was identified that the single crystal has the same crystal structure as the crystal structure of langasite. In the similar manner as in Example 1, the transmission spectrum and the electric resistivity were measured. The results are shown in Table 4.

Comparative Example 5

In Comparative Example 5, a piezoelectric material including a CTGS single crystal in which the element M is Ga was produced by a CZ method that had been described with reference to FIG. 1.

A raw material containing Ca, Ta, Ga, Si, and O was prepared. Specifically, calcium carbonate ($CaCO_3$) raw material powder (123.451 g) having a purity of 99.99%, tantalum oxide ($Ta_2O_5$) raw material powder (90.837 g) having a purity of 99.99%, gallium oxide ($Ga_2O_3$) raw material powder (115.607 g) having a purity of 99.99%, and silicon dioxide ($SiO_2$) raw material powder (49.436 g) having a purity of 99.99% were dry-mixed, and the resultant mixture was placed in an alumina crucible, and a fired body was obtained.

Ca, Ta, Ga, and Si in the mixed raw material powder satisfied Ca:Ta:Ga:Si=3:1:3:2 (atom ratio). As the firing temperature profile, the temperature was raised from 0° C. to 1270° C. over 8 hours, retained at a temperature of 1270° C. for 25 hours, and then cooled down to 0° C. over 8 hours.

As a result of powder X-ray diffraction of the obtained fired body, it was confirmed that the fired body has the same crystal structure as the crystal structure of langasite, and is obtained in a single phase. In addition, it was confirmed that Ca, Ta, Ga, and Si in the obtained fired body satisfy Ca:Ta:Ga:Si=3:1:3:2 (atom ratio). The fired body thus obtained was used as a raw material containing Ca, Ta, Ga, Si, and O.

Except that the fired body (320 g) thus obtained was filled in a crucible made of Pt, and the atmosphere at the time of single crystal growth was set to the air (the oxygen content was 18% by volume or more), Comparative Example 5 was performed in the similar manner as in Example 3. In the similar manner as in Example 1, the appearance of the single crystal was observed, and the powder X-ray diffraction was performed, as a result, it was identified that the single crystal has the same crystal structure as the crystal structure of langasite. In the similar manner as in Example 1, the composition analysis was performed, the transmission spectrum, the oxygen diffusion profile, and the electric resistivity were measured, and the piezoelectric characteristics were evaluated. In the similar manner as in Example 1, the oxygen diffusion coefficient was determined. The results are shown in FIGS. 4, 6, 9 and 10, and Tables 2, 3, and 4.

Example 6

In Example 6, the CTGS single crystal produced in Example 1 was subjected to heat treatment at 1200° C. for 10 hours in the air (the oxygen content was 18% by volume or more). As the temperature profile of the heat treatment, the temperature was raised from 0° C. to 1200° C. over 8 hours, retained at 1200° C. for 10 hours, and then cooled down to 0° C. over 20 hours. A y-cut plate having a 10 mm square and a 1 mm thickness was cut out from the CTGS single crystal after heat treatment, and both surfaces of the y-cut plate were mirror polished. A platinum electrode was formed on the y plane of this sample by sputtering, and a piezoelectric element was produced. The temperature dependence of the electric resistivity of this piezoelectric element was measured by a three-terminal method. The results are shown in Table 5.

Example 7

In Example 7, the CTGS single crystal produced in Example 1 was subjected to heat treatment at 1200° C. for 10 hours in an atmosphere of $N_2$ gas as the inert gas. In the similar manner as in Example 6, the electric resistivity was measured. The results are shown in Table 5.

Example 8

In Example 8, a piezoelectric material including a CTAS single crystal in which the element M is Al was produced by a CZ method that had been described with reference to FIG. 1.

At first, a raw material containing Ca, Ta, Al, Si, and O was prepared. Specifically, calcium carbonate ($CaCO_3$) raw material powder (120.143 g) having a purity of 99.99%, tantalum oxide ($Ta_2O_5$) raw material powder (88.404 g) having a purity of 99.99%, aluminum oxide ($Al_2O_3$) raw material powder (61.218 g) having a purity of 99.99%, and silicon dioxide ($SiO_2$) raw material powder (48.082 g) having a purity of 99.99% were dry-mixed, and the resultant mixture was placed in an alumina crucible, and a fired body was obtained.

Ca, Ta, Al, and Si in the mixed raw material powder satisfied Ca:Ta:Al:Si=3:1:3:2 (atom ratio). As the firing temperature profile, the temperature was raised from 0° C. to 1300° C. over 8 hours, retained at a temperature of 1300° C. for 20 hours, and then cooled down to 0° C. over 8 hours. As a result of powder X-ray diffraction of the obtained fired body, it was confirmed that the fired body has the same crystal structure as the crystal structure of langasite, and is obtained in a single phase. In addition, it was confirmed that Ca, Ta, Al, and Si in the obtained fired body satisfy Ca:Ta:Al:Si=3:1:3:2 (atom ratio). The fired body thus obtained was used as a raw material containing Ca, Ta, Al, Si, and O.

The fired body thus obtained was filled in a crucible made of Pt, and melted (Step S110). The weight of the raw material powder filled in the crucible was 262 g. The shape of the crucible was cylindrical, the diameter was around 50 mm, and the height was around 50 mm.

Next, the tip of a seed crystal (size: 2 mm×2 mm×40 mm, a axis) of a square-bar shape of the CTAS represented by $Ca_3TaAl_3Si_2O_{14}$ was brought into contact with a melt, the seed crystal was pulled up at a speed of 0.5 mm per hour while being rotated at a rotation speed of 12 rpm, and a single crystal in a bulk state was grown (Step S120). Note that after completion of the growth, it took 40 hours to cool down to room temperature.

Figure 5:
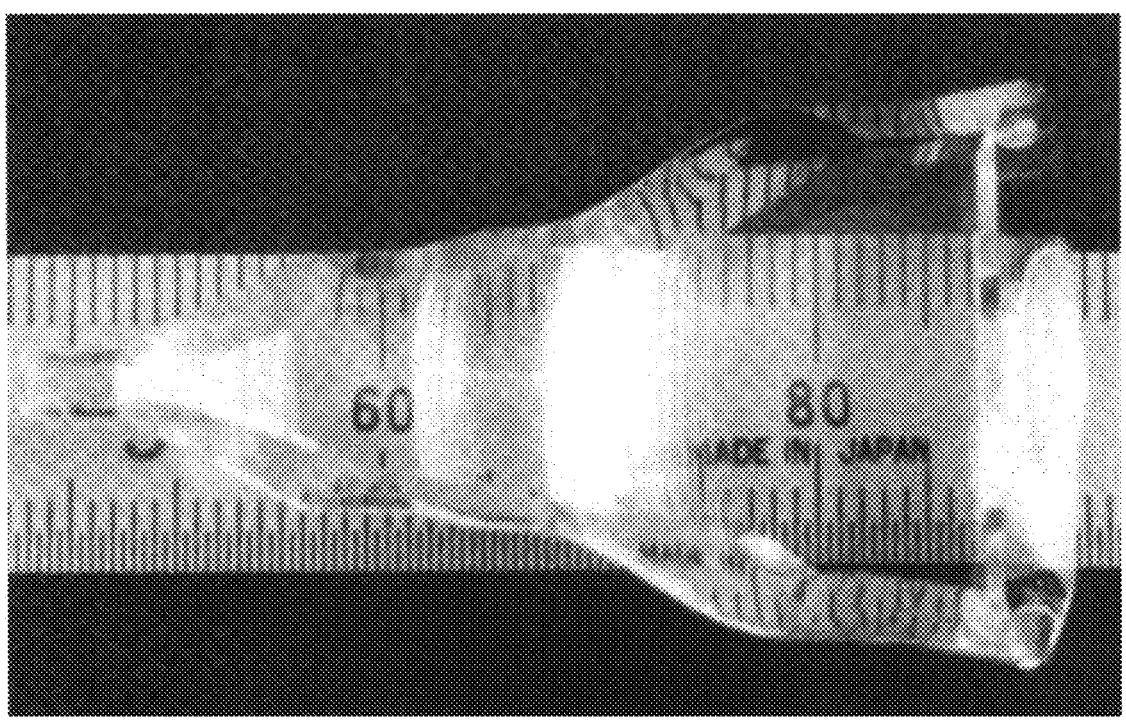
FIG. 5 is a drawing showing the observation result of a single crystal of Example 8.

Growth of this crystal was performed under an atmosphere of $N_2$ gas containing oxygen as the inert gas. The oxygen content was 1.2% by volume. The appearance of the obtained single crystal was observed. The result is shown in FIG. 5. Next, as a result of powder X-ray diffraction of the obtained single crystal, it was confirmed that the fired body has the same crystal structure as the crystal structure of langasite, and is obtained in a single phase.

By XRF, the composition (mole ratio of Ca, Ta, Al, and Si) of a single crystal was confirmed. The results are shown in Tables 2 and 3.

Figure 11:
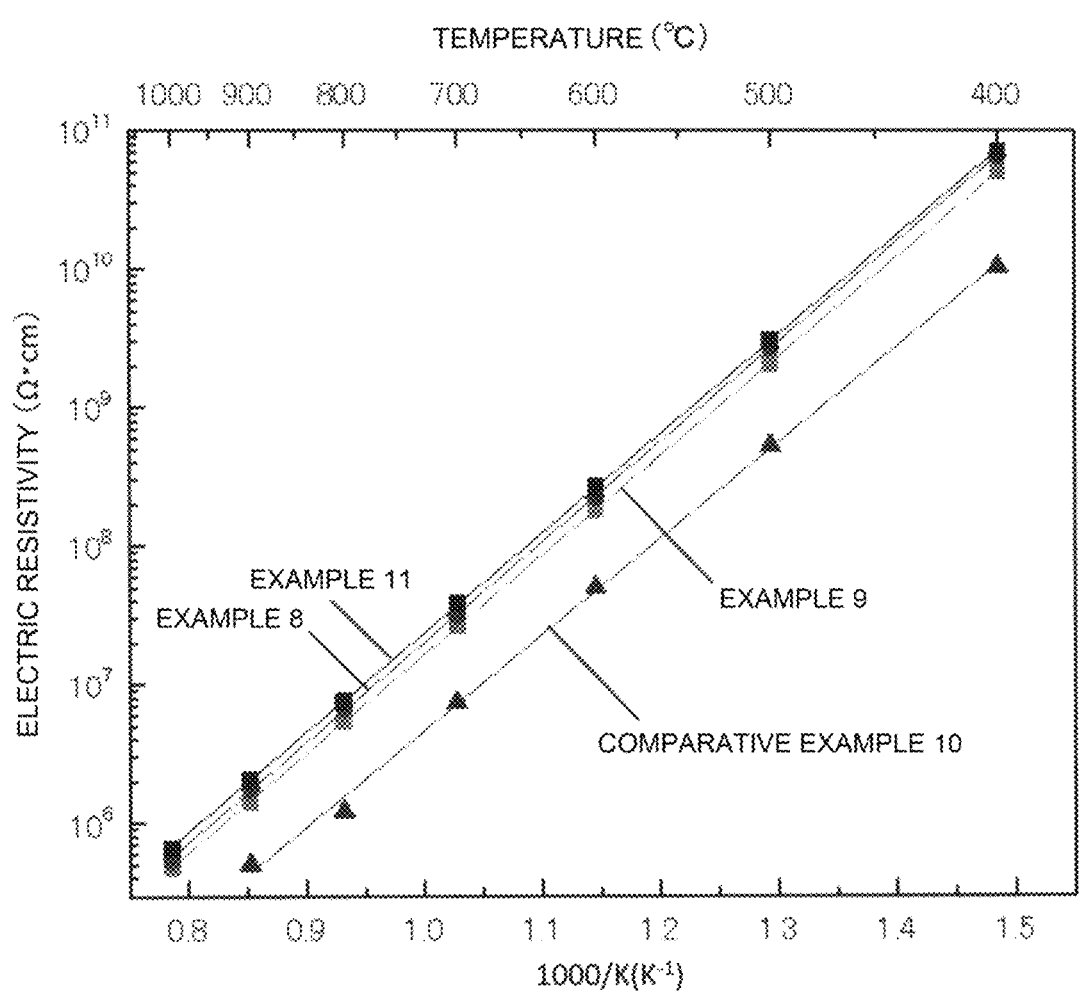
FIG. 11 is a drawing showing the temperature dependency of the electric resistivity of single crystals of Examples 8, 9, and 11 and Comparative Example 10.

A y-cut plate having a 10 mm square and a 1 mm thickness was cut out from the single crystal, and both surfaces of the y-cut plate were mirror polished. The transmission spectrum of this sample was measured. In addition, as described above with reference to FIG. 2, a platinum electrode was formed on the y plane of this sample by sputtering, and a piezoelectric element was produced. The temperature dependence of the electric resistivity of this piezoelectric element was measured by a three-terminal method, and the piezoelectric characteristics (piezoelectric constant $d_{11}$ and electromechanical coupling constant $K_{12}$) were measured with an impedance analyzer and an LCR meter. The results are shown in FIG. 11 and Table 4.

Example 9

In Example 9, a piezoelectric material including a CTAS single crystal in which the element M is Al was produced by a CZ method that had been described with reference to FIG. 1 in the similar manner as in Example 8. However, different from Example 8, in the firing temperature profile, the retention time was set to 25 hours, the filling amount of the fired body was set to 261 g, and at the time of single crystal growth, the single crystal growth was performed under an atmosphere of $N_2$ gas not containing oxygen as to the inert gas. In the similar manner as in Example 8, the appearance of the single crystal was observed, and the powder X-ray diffraction was performed, as a result, it was identified that the single crystal has the same crystal structure as the crystal structure of langasite. In the similar manner as in Example 8, the transmission spectrum and the electric resistivity were measured, and the piezoelectric characteristics were evaluated. The results are shown in FIG. 11 and Table 4.

Comparative Example 10

In Comparative Example 10, a piezoelectric material including a CTAS single crystal in which the element M is Al was produced by a CZ method that had been described with reference to FIG. 1.

A raw material containing Ca, Ta, Al, Si, and O was prepared. Specifically, calcium carbonate ($CaCO_3$) raw material powder (133.743 g) having a purity of 99.99%, tantalum oxide ($Ta_2O_5$) raw material powder (98.411 g) having a purity of 99.99%, aluminum oxide ($Al_2O_3$) raw material powder (68.121 g) having a purity of 99.99%, and silicon dioxide ($SiO_2$) raw material powder (53.53 g) having a purity of 99.99% were dry-mixed, and the resultant mixture was placed in an alumina crucible, and a fired body was obtained.

Ca, Ta, Al, and Si in the mixed raw material powder satisfied Ca:Ta:Al:Si=3:1:3:2 (atom ratio). As the firing temperature profile, the temperature was raised from 0° C. to 1250° C. over 8 hours, retained at a temperature of 1250° C. for 25 hours, and then cooled down to 0° C. over 8 hours. As a result of powder X-ray diffraction of the obtained fired body, it was confirmed that the fired body has the same crystal structure as the crystal structure of langasite, and is obtained in a single phase. In addition, it was confirmed that Ca, Ta, Al, and Si in the obtained fired body satisfy Ca:Ta:Al:Si=3:1:3:2 (atom ratio). The fired body thus obtained was used as a raw material containing Ca, Ta, Al, Si, and O.

The fired body thus obtained was filled in a crucible made of Pt, and melted (Step S110). The weight of the raw material powder filled in the crucible was 257.466 g. The shape of the crucible was cylindrical, the diameter was around 50 mm, and the height was around 50 mm.

Next, the tip of a seed crystal (size: 2 mm×2 mm×40 mm, a axis) of a square-bar shape of the CTAS represented by $Ca_3TaAl_3Si_2O_{14}$ was brought into contact with a melt, the seed crystal was pulled up at a speed of 0.5 mm per hour while being rotated at a rotation speed of 12 rpm, and a single crystal in a bulk state was grown (Step S120). Note that after completion of the growth, it took 29 hours to cool down to room temperature. Growth of this crystal was performed in the air (the oxygen content was 18% by volume or more).

Figure 7:
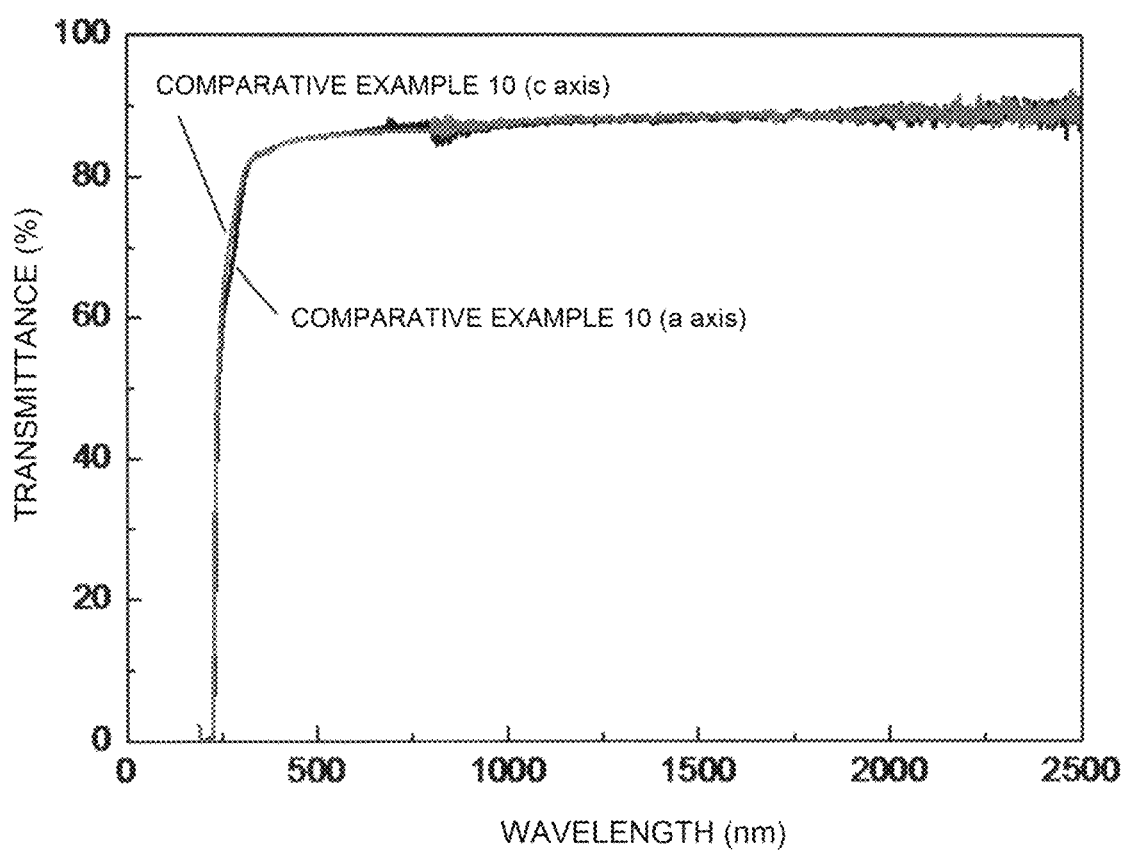
FIG. 7 is a drawing showing the transmission spectra of a single crystal of Comparative Example 10.

In the similar manner as in Example 8, the appearance of the single crystal was observed, and the powder X-ray diffraction was performed, as a result, it was identified that the single crystal has the same crystal structure as the crystal structure of langasite. In the similar manner as in Example 8, the composition analysis was performed by XRF, the transmission spectrum and the electric resistivity were measured, and the piezoelectric characteristics were evaluated. The results are shown in FIGS. 7, and 11, and Tables 2, 3, and 4.

Example 11

In Example 11, a piezoelectric material including a CTAS single crystal in which the element M is Al was produced by a CZ method that had been described with reference to FIG. 1 in the similar manner as in Example 9. However, different from Example 9, a crucible made of Ir was employed in the single crystal growth. In the similar manner as in Example 8, the appearance of the single crystal was observed, and the powder X-ray diffraction was performed, as a result, it identified that the single crystal has the same crystal structure as the crystal structure of langasite. In the similar manner as in Example 8, the transmission spectrum and the electric resistivity were measured. The results are shown in FIG. 11 and Table 4.

Example 12

In Example 12, a piezoelectric material including a CTAS single crystal in which the element M is Al was produced by a CZ method that had been described with reference to FIG. 1 in the similar manner as in Example 11. However, different from Example 11, the oxygen content in the inert gas ($N_2$ gas) at the time of single crystal growth was 1.3% by volume. In the similar manner as in Example 8, the appearance of the single crystal was observed, and the powder X-ray diffraction was performed, as a result, it was identified that the single crystal has the same crystal structure as the crystal structure of langasite. In the similar manner as in Example 8, the transmission spectrum and the electric resistivity were measured. The results are shown in Table 4.

A list of growth conditions of single crystals of Examples and Comparative Examples 1 to 12 described above is summarized in Table 1 for the sake of simplicity.

Next, the presence or absence of the defects will be described from the transmission spectra and the oxygen diffusion coefficients of Examples and Comparative Examples.

FIG. 6 is a drawing showing the transmission spectra of single crystals of Example 1 and Comparative Example 5.

FIG. 7 is a drawing showing the transmission spectra of a single crystal of Comparative Example 10.

As shown in FIG. 6, the transmission spectrum of the single crystal of Example 1 showed absorption at a wavelength of 300 to 500 nm. On the other hand, the transmission spectrum of the single crystal of Comparative Example 5 did not show any absorption at a wavelength of 300 to 500 nm. Although not shown, the transmission spectra of the single crystals of Examples 2 to 4 also showed absorption at a wavelength of 300 to 500 nm as in the case of Example 1.

As shown in FIG. 7, the transmission spectrum of the single crystal of Comparative Example 10 did not show any absorption at a wavelength of 300 to 500 nm. Although not shown, it was confirmed that the single crystals of Examples 8, 9, 11 and 12 showed slight absorption at a wavelength of 300 to 500 nm.

As shown in FIGS. 6 and 7 described above, it was found that by being grown in an atmosphere where the oxygen

TABLE 1

List of growth conditions of the crystals of Examples and Comparative Examples 1 to 12

| | | Atmosphere | | | Pulling speed | Rotational speed | Heat treatment | |
|---|---|---|---|---|---|---|---|---|
| | Kind | $N_2$ vol % | $O_2$ vol % | Crucible | (mm/h) | (rpm) | Atmosphere | Temperature (° C.), Hours (h) |
| Example 1 | CTGS | 98.7 | 1.3 | Made of Ir | 0.5 | 12 | — | — |
| Example 2 | | 100 | 0 | Made of Ir | 0.5 | 12 | — | — |
| Example 3 | | 100 | 0 | Made of Pt | 0.5 | 12 | — | — |
| Example 4 | | 98.7 | 1.2 | Made of Pt | 0.5 | 12 | — | — |
| Comparative Example 5 | | In the air (18 ≥ $O_2$ vol %) | | Made of Pt | 0.5 | 12 | — | — |
| Example 6 | | 98.7 | 1.3 | Made of Ir | 0.5 | 12 | In the air | 1200° C., 10 h |
| Example 7 | | 98.7 | 1.3 | Made of Ir | 0.5 | 12 | $N_2$ | 1200° C., 10 h |
| Example 8 | CTAS | 98.8 | 1.2 | Made of Pt | 0.5 | 12 | — | — |
| Example 9 | | 100 | 0 | Made of Pt | 0.5 | 12 | — | — |
| Comparative Example 10 | | In the air (18 ≥ $O_2$ vol %) | | Made of Pt | 0.5 | 12 | — | — |
| Example 11 | | 100 | 0 | Made of Ir | 0.5 | 12 | — | — |
| Example 12 | | 98.7 | 1.3 | Made of Ir | 0.5 | 12 | | |

At first, the appearance of the single crystals of Examples and Comparative Examples will be described.

FIG. 3 is a drawing showing the observation result of a single crystal of Example 1.

Figure 4:
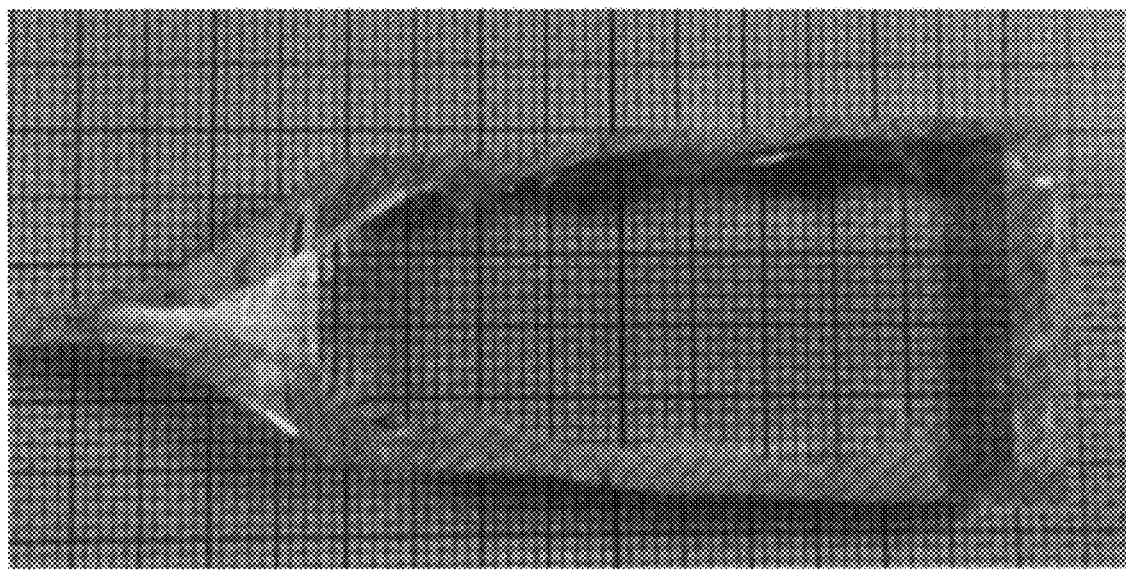
FIG. 4 is a drawing showing the observation result of a single crystal of Comparative Example 5.

FIG. 4 is a drawing showing the observation result of a single crystal of Comparative Example 5.

FIG. 5 is a drawing showing the observation result of a single crystal of Example 8.

As shown in FIGS. 3 to 5, all of the crystals were transparent single crystals. Note that although not shown, transparent single crystals were similarly obtained in other Examples.

content in the inert gas satisfies the range of 0% by volume or more and 1.5% by volume or less, the single crystal of the present invention has defects.

Next, results of the compositions of the single crystals obtained in Examples and Comparative Examples are shown in Tables 2 and 3. Note that in the composition analysis by XRF, positive ions (cations) were detected in weight ratio (wt %). In the present specification, the total number of positive ions was set to 9, and the mole ratio was determined.

With regard to oxygen, assuming that there is enough oxygen corresponding to the total amount of the obtained positive ions, that is, there is enough oxygen to ensure the charge neutrality, the calculation was performed.

TABLE 2

List of composition analysis (XRF) of the crystals of Examples and Comparative Examples 1, 5, 8, 10, and 11

| | | Atmosphere | | | Design composition | | | | Actual composition | | | | |
|---|---|---|---|---|---|---|---|---|---|---|---|---|---|
| | Kind | $N_2$ vol % | $O_2$ vol % | Crucible | Ca | Ta | Al/Ga | Si | Ca | Ta | Al/Ga | Si | O* |
| Example 1 | CTGS | 98.7 | 1.3 | Made of Ir | 3 | 1 | 3 | 2 | 3.1758 | 1.0115 | 2.7982 | 2.0145 | 13.9308 |
| Comparative Example 5 | | In the air (18 ≥ $O_2$ vol %) | | Made of Pt | 3 | 1 | 3 | 2 | 3.1508 | 1.0119 | 2.8332 | 2.0040 | 13.9383 |
| Example 8 | CTAS | 98.8 | 1.2 | Made of Pt | 3 | 1 | 3 | 2 | 3.0501 | 0.9815 | 2.9049 | 2.0636 | 13.9884 |
| Comparative Example 10 | | In the air (18 ≥ $O_2$ vol %) | | Made of Pt | 3 | 1 | 3 | 2 | 2.94 | 1.01 | 3.01 | 2.04 | 14.06 |
| Example 11 | | 100 | 0 | Made of Ir | 3 | 1 | 3 | 2 | 3.0615 | 0.9710 | 2.9330 | 2.0345 | 13.9575 |

*The oxygen amount is calculated so as to satisfy the charge neutrality on the basis of Ca, Ta, Al/Ga, and Si.

TABLE 3

List of mole ratios of elements in the crystals of Examples and Comparative Examples 1, 5, 8, 10, and 11

| | | Atmosphere | | | Mole ratio | | | | | |
|---|---|---|---|---|---|---|---|---|---|---|
| | Kind | $N_2$ vol % | $O_2$ vol % | Crucible | Ca/Ta | Ga/Ta | Si/Ta | Ca/Si | Ta/Si | Al/Si |
| Example 1 | CTGS | 98.7 | 1.3 | Made of Ir | 3.139 | 2.766 | 1.991 | — | — | — |
| Comparative Example 5 | | In the air (18 ≥ $O_2$ vol %) | | Made of Pt | 3.113 | 2.799 | 1.980 | — | — | — |
| Example 8 | CTAS | 98.8 | 1.2 | Made of Pt | — | — | — | 1.478 | 0.478 | 1.407 |
| Comparative Example 10 | | In the air (18 ≥ $O_2$ vol %) | | Made of Pt | — | — | — | 1.441 | 0.495 | 1.475 |
| Example 11 | | 100 | 0 | Made of Ir | — | — | — | 1.504 | 0.477 | 1.441 |

As shown in Table 2, it was found that as to the CTGS single crystal, the content of the Ga is insufficient for the stoichiometric composition, and each content of the Ca and the Si is excessive for the stoichiometric composition. As shown in Table 2, it was found that as to the CTAS single crystal, each content of the Al and Ta is insufficient for the stoichiometric composition, and the content of the Ca is excessive for the stoichiometric composition.

In detail, as shown in Table 2, it was confirmed that the single crystal of the present invention is represented by the general formula $Ca_pTa_qM_rSi_sO_t$ in which the element M is Ga, and the parameters p, q, r, s, and t are p+q+r+s=9, and satisfy $3.15 < p \leq 3.25$, $0.98 \leq q \leq 1.02$, $2.5 \leq r \leq 2.83$, $2.004 < s \leq 2.05$, and $13.9 \leq t \leq 14.1$.

Further, it was confirmed that the parameters p, q, r, s, and t satisfy $3.17 \leq p \leq 3.18$, $0.99 \leq q \leq 1.015$, $2.5 \leq r \leq 2.8$, $2.01 \leq s \leq 2.02$, and $13.9 \leq t \leq 14.1$.

It was confirmed that the single crystal of the present invention is represented by the general formula $Ca_pTa_qM_rSi_sO_t$ in which the element M is Al, and the parameters p, q, r, s, and t are p+q+r+s=9, and satisfy $2.94 < p \leq 3.25$, $0.95 \leq q < 1.01$, $2.8 \leq r < 3.01$, $2 < s \leq 2.1$, and $13.9 \leq t \leq 14.1$.

Further, it was confirmed that the parameters p, q, r, s, and t satisfy $3 < p \leq 3.1$, $0.97 \leq q \leq 0.99$, $2.9 \leq r \leq 2.95$, $2.03 \leq s \leq 2.07$, and $13.9 \leq t \leq 14.1$.

As shown in Table 3, it was confirmed that in a case where the M is Ga, a mole ratio of the Ca to the Ta is more than 3.11 and 3.31 or less, a mole ratio of the M to the Ta is 2.45 or more and 2.79 or less, and a mole ratio of the Si to the Ta is more than 1.98 and 2.09 or less, and in detail, a mole ratio of the Ca to the Ta is more than 3.11 and 3.21 or less, a mole ratio of the M to the Ta is 2.5 or more and 2.79 or less, and a mole ratio of the Si to the Ta is more than 1.98 and 2.0 or less.

Similarly, as shown in Table 3, it was confirmed that in a case where the M is Al, a mole ratio of the Ca to the Si is more than 1.44 and 1.63 or less, a mole ratio of the Ta to the Si is 0.45 or more and 0.49 or less, and a mole ratio of the M to the Si is 1.33 or more and 1.47 or less, and in detail, a mole ratio of the Ca to the Si is more than 1.44 and 1.52 or less, a mole ratio of the Ta to the Si is 0.46 or more and 0.49 or less, and a mole ratio of the M to the Si is 1.39 or more and 1.45 or less.

Next, the electric resistivity and the piezoelectric characteristics of single crystals of Examples and Comparative Examples will be described.

FIG. 10 is a drawing showing the temperature dependency of the electric resistivity of single crystals of Example 1 and Comparative Example 5.

FIG. 11 is a drawing showing the temperature dependency of the electric resistivity of single crystals of Examples 8, 9, and 11 and Comparative Example 10.

TABLE 4

List of the electric resistivity (@400° C.) and the piezoelectric characteristics (@RT) of the crystals of Examples and Comparative Examples 1 to 5, and 8 to 12

| | | Atmosphere | | | Electric resistivity @400° C. | Piezoelectric constant $d_{11}$@RT | Electromechanical coupling constant $K_{12}$@RT |
|---|---|---|---|---|---|---|---|
| | Kind | $N_2$ (vol %) | $O_2$ (vol %) | Crucible | (Ωcm) | (pC/N) | (%) |
| Example 1 | CTGS | 98.7 | 1.3 | Made of Ir | $1.6 \times 10^{10}$ | 4.07 | 10.9 |
| Example 2 | | 100 | 0 | Made of Ir | $>1.0 \times 10^{10}$ | — | — |
| Example 3 | | 100 | 0 | Made of Pt | $>1.0 \times 10^{10}$ | — | — |
| Example 4 | | 98.7 | 1.2 | Made of Pt | $>1.0 \times 10^{10}$ | — | — |
| Comparative Example 5 | | In the air (18 ≥ $O_2$ vol %) | | Made of Pt | $6.1 \times 10^9$ | 4.12 | 11.3 |
| Example 8 | CTAS | 98.8 | 1.2 | Made of Pt | $6.5 \times 10^{10}$ | 4.31 | 13.2 |
| Example 9 | | 100 | 0 | Made of Pt | $5.0 \times 10^{10}$ | 4.52 | 14.1 |
| Comparative Example 10 | | In the air (18 ≥ $O_2$ vol %) | | Made of Pt | $1.0 \times 10^{10}$ | 3.63 | 11.3 |
| Example 11 | | 100 | 0 | Made of Ir | $7.0 \times 10^{10}$ | — | — |
| Example 12 | | 98.7 | 1.3 | Made of Ir | $>1.0 \times 10^{10}$ | — | — |

FIG. 8 is a drawing showing the $^{18}O$ oxygen diffusion profile of a single crystal of Example 1.

Figure 9:
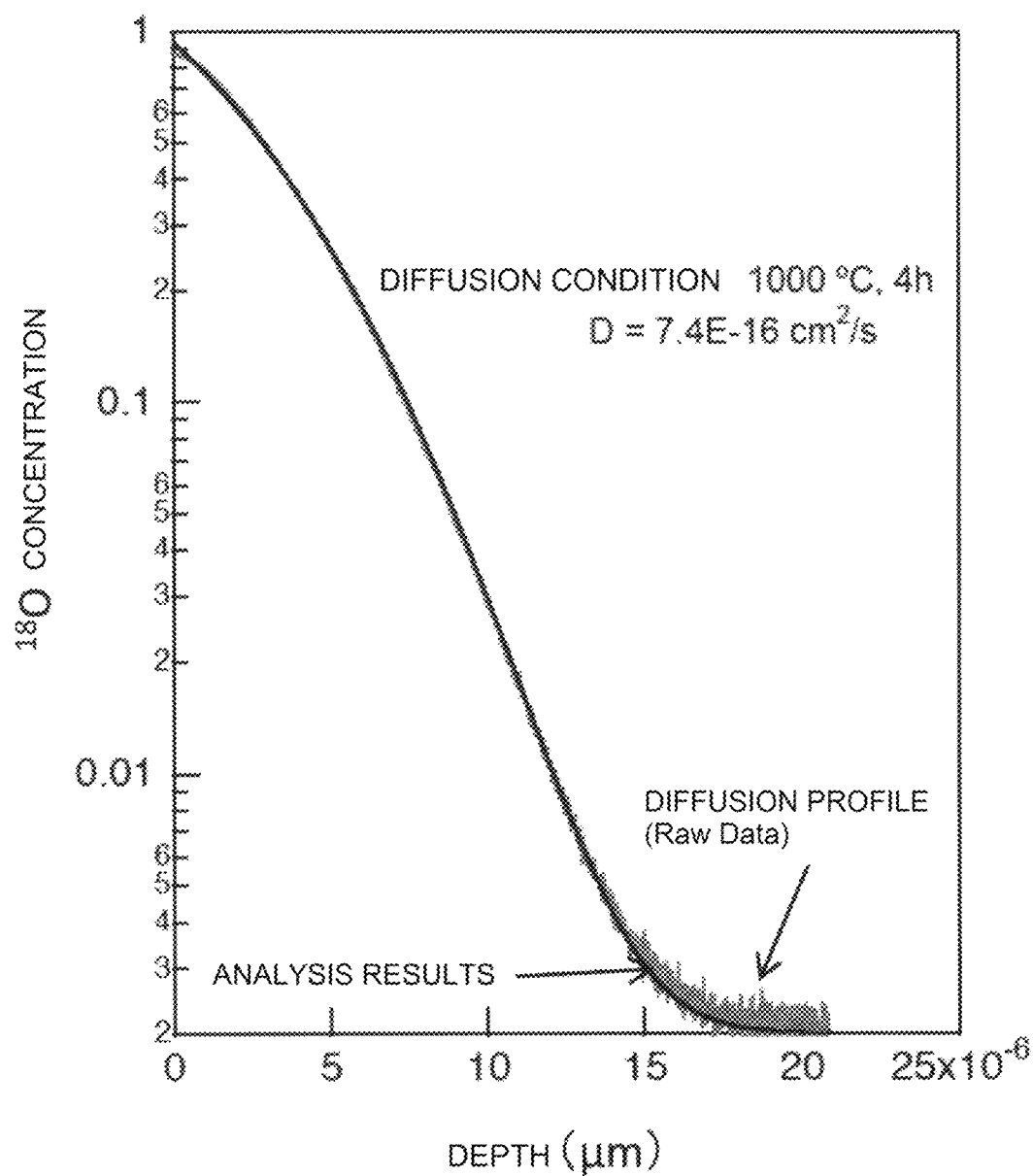
FIG. 9 is a drawing showing the $^{18}O$ oxygen diffusion profile of a single crystal of Comparative Example 5.

FIG. 9 is a drawing showing the $^{18}O$ oxygen diffusion profile of a single crystal of Comparative Example 5.

In FIGS. 8 and 9, the vertical axis is the $^{18}O$ concentration when the total oxygen is set to 1, and is a percentage (%) when being multiplied by 100. From the oxygen diffusion profiles of FIGS. 8 and 9, the $^{18}O$ concentration was calculated using the following equation.

$$C_{(x,t)}[^{18}O] = I[^{18}O]/[I[^{18}O]+I[^{16}O]]$$

Herein, the $C_{(x,t)}[^{18}O]$ is the concentration of $^{18}O$ at each depth, and each of $I[^{18}O]$ and $I[^{16}O]$ is the intensity. The profiles of FIGS. 8 and 9 were solved according to Fick's second law under the boundary condition of constant surface concentration.

$$((C_{(x,t)}-C_0)/(C_s-C_0)) = erfc(x/2\sqrt{(D_T t)})$$

Herein, the $C_0$ is the background concentration, the $C_s$ is the surface concentration, the x is the depth, and the t is the diffusion annealing time. The oxygen diffusion coefficients obtained from this equation were $6.5 \times 10^{-16}$ cm²/s (Example 1), and $7.4 \times 10^{-16}$ cm²/s (Comparative Example 5), respectively.

As shown in FIGS. 8 and 9 described above, the single crystal of the present invention is controlled so that the oxygen defects are reduced, and specifically, the oxygen diffusion coefficient of the single crystal of the present invention is controlled so as to be less than $7.0 \times 10^{-16}$ cm²/s, in detail, it was found that the oxygen diffusion coefficient satisfies $5.5 \times 10^{-15}$ cm²/s or more and $6.5 \times 10^{-16}$ cm²/s or less.

As shown in FIGS. 6 to 9, and Table 2 described above, it was confirmed that the single crystal of the present invention has a composition in which the desired cation and oxygen deviate from the stoichiometric composition.

As shown in FIG. 10, the electric resistivity of the single crystal of Example 1 was higher than that in Comparative Example 5 in the entire temperature range (300° C. to 800° C.) in which the measurement had been performed. Although not shown, the electric resistivity of each of the single crystals of Examples 2 to 4 was also higher than that of Comparative Example 5 in the entire temperature range.

As shown in FIG. 11, the electric resistivity of each of the single crystals of Examples 8, 9, and 11 was higher than that in Comparative Example 10 in the entire temperature range (400° C. to 1000° C.) in which the measurement had been performed. Although not shown, the electric resistivity of the single crystal of Example 12 was also higher than that of Comparative Example 10 in the entire temperature range.

As shown in Table 4, it was confirmed that the single crystals of Examples of the present invention have a high piezoelectric constant and an electromechanical coupling constant, and is a piezoelectric material. In addition, it was found that the electric resistivities at 400° C. of all of the single crystals of Examples of the present invention exceed $1.0 \times 10^{10}$ Ω·cm. In particular, it was found that the CTAS single crystal in which the element M is Al has an electric resistivity (400° C.) in the range of $5.0 \times 10^{10}$ Ω·cm or more and $7.0 \times 10^{10}$ Ω·cm or less, and is remarkably excellent as compared with the CTGS single crystal in which the element M is Ga.

From FIGS. 10 and 11, and Table 4, it was confirmed that as to the single crystal of the present invention, by being grown in an atmosphere where the oxygen content in the inert gas satisfies the range of 0% by volume or more and 1.5% by volume or less, a single crystal having an electric resistivity at 400° C. of exceeding $1.0 \times 10^{10}$ Ω·cm is obtained, and the single crystal becomes a piezoelectric material for apiezoelectric sensor. In particular, it was confirmed that the element M is preferably Al.

Next, the effect of heat treatment after the growth will be explained.

Table 5: List of electric resistivity at 400° C. before and after heat treatment of the crystals of Examples 6 to 7

| | Kind | Heat treatment Atmosphere | Temperature (° C.), Hours (h) | Electric resistivity before heat treatment @ 400° C. (Ωcm) | Electric resistivity after heat treatment @ 400° C. (Ωcm) |
|---|---|---|---|---|---|
| Example 6 | CTGS | In the air | 1200° C., 10 h | $1.6 \times 10^{10}$ | $2.1 \times 10^{10}$ |
| Example 7 | | $N_2$ | 1200° C., 10 h | $1.6 \times 10^{10}$ | $2.3 \times 10^{10}$ |

As shown in Table 5, the electric resistivities (400° C.) of all of the single crystals of Examples 6 and 7 in which the heat treatment had been performed in the air and in $N_2$ each were increased. According to this, it was found that the single crystal of the present invention is preferably heat-treated in the air or in an inert gas. In particular, the electric resistivity of the single crystal of Example 7 in which the heat treatment had been performed in $N_2$ gas was larger than that of the single crystal of Example 6 in which the heat treatment had been performed in the air. This indicates that the atmosphere in the heat treatment is preferably an atmosphere of an inert gas.

INDUSTRIAL APPLICABILITY

The piezoelectric material of the present invention, which includes a single crystal containing Ca, Ta, an element M (M is Al or Ga), Si, and O, has high electric resistivity at high temperature, and is advantageous for use at high temperature. In particular, a piezoelectric material including a CTAS single crystal in which the element M is Al has extremely high electric resistivity at high temperature, therefore, is suitable for a piezoelectric sensor to be mounted on a combustion pressure sensor.

REFERENCE SIGNS LIST

20 Crystal pulling furnace
21 Crucible
22 Cylindrical container
23 High frequency coil
24 Melt
25 Seed crystal
26 Grown crystal
200 Piezoelectric element
210 Single crystal
220 and 230 Electrode

The invention claimed is:

1. A piezoelectric material, comprising
a single crystal containing Ca, Ta, an element M, Si, and O, wherein M is Al or Ga,
the single crystal has the same crystal structure as a crystal structure of langasite represented by $La_3Ga_5SiO_{14}$,
at least a content of the element M is insufficient for the stoichiometric composition represented by $Ca_3TaM_3Si_2O_{14}$, and
an oxygen diffusion coefficient of the single crystal is $5.5 \times 10^{-15}$ cm$^2$/s or more and less than $7.0 \times 10^{-16}$ cm$^2$/s.

2. The piezoelectric material according to claim 1, wherein
the element M is Ga, and
each content of the Ca and the Si is excessive for the stoichiometric composition.

3. The piezoelectric material according to claim 2, wherein
a mole ratio of the Ca to the Ta is more than 3.11 and 3.31 or less,
a mole ratio of the Ga to the Ta is 2.45 or more and 2.79 or less, and
a mole ratio of the Si to the Ta is more than 1.98 and 2.09 or less.

4. The piezoelectric material according to claim 1, wherein
the element M is Al,
a content of the Ca is excessive for the stoichiometric composition, and
a content of the Ta is insufficient for the stoichiometric composition.

5. The piezoelectric material according to claim 4, wherein
a mole ratio of the Ca to the Si is more than 1.44 and 1.63 or less,
a mole ratio of the Ta to the Si is 0.45 or more and 0.49 or less, and
a mole ratio of the Al to the Si is 1.33 or more and 1.47 or less.

6. The piezoelectric material according to claim 4, wherein
electric resistivity at 400° C. in the single crystal is in a range of $5.0 \times 10^{10}$ Ω·cm or more and $9.0 \times 10^{10}$ Ω·cm or less.

7. The piezoelectric material according to claim 1, wherein
the single crystal is represented by the general formula $Ca_pTa_qM_rSi_sO_t$,
where the element M is Ga, and
parameters p, q, r, s, and t are p+q+r+s=9, and satisfy $3.15 < p \leq 3.25$, $0.98 \leq q \leq 1.02$, $2.5 \leq r \leq 2.83$, $2.004 < s \leq 2.05$, and $13.9 \leq t \leq 14.1$.

8. The piezoelectric material according to claim 7, wherein
the parameters p, q, r, s, and t satisfy $3.17 \leq p \leq 3.18$, $0.99 \leq q \leq 1.015$, $2.5 \leq r \leq 2.8$, $2.01 < s \leq 2.02$, and $13.9 \leq t \leq 14.1$.

9. The piezoelectric material according to claim 1, wherein the single crystal is represented by the general formula $Ca_p Ta_q M_r Si_s O_t$, where the element M is Al, and parameters p, q, r, s, and t are p+q+r+s=9, and satisfy $2.94 < p \leq 3.25,$ $0.95 \leq q < 1.01,$ $2.8 \leq r < 3.01,$ $2 < s \leq 2.1,$ and $13.9 \leq t \leq 14.1.$ 10. The piezoelectric material according to claim 9, wherein the parameters p, q, r, s, and t satisfy $3 < p \leq 3.1,$ $0.97 \leq q \leq 0.99,$ $2.9 \leq r \leq 2.95,$ $2.03 \leq s \leq 2.07,$ and $13.9 \leq t \leq 14.1.$ 11. A method for producing the piezoelectric material according to claim 1, comprising the following steps of:

melting a raw material containing Ca, Ta, an element M, Si, and O, wherein M is Al or Ga; and bringing a seed crystal into contact with a melt of the raw material obtained in the step of melting, and pulling up the seed crystal, wherein the step of melting and the step of pulling up are performed under an inert gas, and an oxygen content in the inert gas satisfies a range of 0.5% by volume or more and 1.5% by volume or less.

12. The method according to claim 11, wherein the raw material is prepared such that the Ca, the Ta, the element M, and the Si in the raw material satisfy the atomic ratio of Ca:Ta:element M:Si=3:1:3:2.

13. The method according to claim 11, wherein the raw material is filled in a crucible made of Ir, and the step of melting and the step of pulling up are performed under an inert gas where oxygen content satisfies a range of 0.5% by volume or more and 1.3% by volume or less.

14. The method according to claim 11, further comprising the step of performing heat treatment in an inert gas or in the air to control oxygen defects.

15. The method according to claim 14, wherein the step of performing heat-treatment is performed in a temperature range of 1150° C. or more and 1250° C. or less for 2 hours or more and 24 hours or less in an inert gas.

16. A piezoelectric element, comprising a piezoelectric material, wherein the piezoelectric material is the piezoelectric material according to claim 1.

17. A combustion pressure sensor, comprising a piezoelectric element, wherein the piezoelectric element is the piezoelectric element according to claim 16.

* * * * *